(12) United States Patent
Widjaja

(10) Patent No.: US 11,488,665 B2
(45) Date of Patent: *Nov. 1, 2022

(54) SEMICONDUCTOR MEMORY HAVING BOTH VOLATILE AND NON-VOLATILE FUNCTIONALITY AND METHOD OF OPERATING

(71) Applicant: Zeno Semiconductor, Inc., Sunnyvale, CA (US)

(72) Inventor: Yuniarto Widjaja, Cupertino, CA (US)

(73) Assignee: Zeno Semiconductor, Inc., Sunnyvale, CA (US)

( * ) Notice: Subject to any disclaimer, the term of this patent is extended or adjusted under 35 U.S.C. 154(b) by 74 days.

This patent is subject to a terminal disclaimer.

(21) Appl. No.: 17/087,884

(22) Filed: Nov. 3, 2020

(65) Prior Publication Data

US 2021/0050059 A1 Feb. 18, 2021

Related U.S. Application Data

(60) Continuation of application No. 16/591,858, filed on Oct. 3, 2019, now Pat. No. 10,825,520, which is a
(Continued)

(51) Int. Cl.
*G11C 14/00* (2006.01)
*H01L 27/105* (2006.01)
(Continued)

(52) U.S. Cl.
CPC ........ *G11C 14/0018* (2013.01); *G11C 11/404* (2013.01); *G11C 16/0408* (2013.01); *G11C 16/0466* (2013.01); *G11C 16/0483* (2013.01); *G11C 16/225* (2013.01); *H01L 27/105* (2013.01); *H01L 27/108* (2013.01);
(Continued)

(58) Field of Classification Search
CPC combination set(s) only.
See application file for complete search history.

(56) References Cited

U.S. PATENT DOCUMENTS 4,300,212 A 11/1981 Simko
4,959,812 A 9/1990 Momodomi et al.
(Continued)

OTHER PUBLICATIONS

Ban et al., A Scaled Floating Body Cell (FBC) Memory with High-k+Metal Gate on Thin-Silicon and Thin-BOX for 16-nm Technology Node and Beyond, Symposium on VLSI Technology, 2008, pp. 92-93.
(Continued)

*Primary Examiner* — Viet Q Nguyen
(74) *Attorney, Agent, or Firm* — Law Office of Alan W. Cannon

(57) ABSTRACT

Semiconductor memory having both volatile and non-volatile modes and methods of operation. A semiconductor storage device includes a plurality of memory cells each having a floating body for storing, reading and writing data as volatile memory. The device includes a floating gate or trapping layer for storing data as non-volatile memory, the device operating as volatile memory when power is applied to the device, and the device storing data from the volatile memory as non-volatile memory when power to the device is interrupted.

17 Claims, 20 Drawing Sheets

Related U.S. Application Data continuation of application No. 15/673,059, filed on Aug. 9, 2017, now Pat. No. 10,468,102, which is a continuation of application No. 15/267,402, filed on Sep. 16, 2016, now Pat. No. 9,761,311, which is a continuation of application No. 14/839,682, filed on Aug. 28, 2015, now Pat. No. 9,460,790, which is a continuation of application No. 14/307,424, filed on Jun. 17, 2014, now Pat. No. 9,153,333, which is a division of application No. 13/903,923, filed on May 28, 2013, now Pat. No. 8,787,058, which is a continuation of application No. 13/246,582, filed on Sep. 27, 2011, now Pat. No. 8,472,249, which is a division of application No. 12/257,023, filed on Oct. 23, 2008, now Pat. No. 8,059,459.

(60) Provisional application No. 60/982,374, filed on Oct. 24, 2007, provisional application No. 60/982,382, filed on Oct. 24, 2007.

(51) Int. Cl.
| | |
|---|---|
| *H01L 27/108* | (2006.01) |
| *H01L 29/40* | (2006.01) |
| *H01L 29/78* | (2006.01) |
| *H01L 21/28* | (2006.01) |
| *G11C 11/404* | (2006.01) |
| *G11C 16/04* | (2006.01) |
| *H01L 27/11521* | (2017.01) |
| *H01L 27/11526* | (2017.01) |
| *H01L 27/11531* | (2017.01) |
| *H01L 27/11568* | (2017.01) |
| *H01L 27/11573* | (2017.01) |
| *H01L 29/423* | (2006.01) |
| *H01L 29/66* | (2006.01) |
| *H01L 29/788* | (2006.01) |
| *H01L 29/792* | (2006.01) |
| *G11C 16/22* | (2006.01) |
| *H01L 29/06* | (2006.01) |
| *H01L 21/84* | (2006.01) |
| *H01L 27/12* | (2006.01) |

(52) U.S. Cl.
CPC .. *H01L 27/10802* (2013.01); *H01L 27/10897* (2013.01); *H01L 27/11521* (2013.01); *H01L 27/11526* (2013.01); *H01L 27/11531* (2013.01); *H01L 27/11568* (2013.01); *H01L 27/11573* (2013.01); *H01L 29/0649* (2013.01); *H01L 29/40114* (2019.08); *H01L 29/40117* (2019.08); *H01L 29/4234* (2013.01); *H01L 29/42324* (2013.01); *H01L 29/66825* (2013.01); *H01L 29/66833* (2013.01); *H01L 29/785* (2013.01); *H01L 29/7841* (2013.01); *H01L 29/7885* (2013.01); *H01L 29/7887* (2013.01); *H01L 29/792* (2013.01); *H01L 29/7923* (2013.01); *G11C 2211/4016* (2013.01); *H01L 21/84* (2013.01); *H01L 27/10826* (2013.01); *H01L 27/10879* (2013.01); *H01L 27/1203* (2013.01)

(56) References Cited

U.S. PATENT DOCUMENTS

| | | | |
|---|---|---|---|
| 5,519,831 A | 5/1996 | Holzhammer | |
| 5,581,504 A | 12/1996 | Chang et al. | |
| 5,767,549 A | 6/1998 | Chen et al. | |
| 5,999,444 A | 12/1999 | Fujiwara et al. | |
| 6,005,818 A | 12/1999 | Ferrant et al. | |
| 6,104,045 A | 8/2000 | Forbes et al. | |
| 6,141,248 A | 10/2000 | Forbes et al. | |
| 6,163,048 A | 12/2000 | Hirose et al. | |
| 6,166,407 A | 12/2000 | Ohta | |
| 6,229,161 B1 | 5/2001 | Nemati et al. | |
| 6,341,087 B1 | 1/2002 | Kunikiyo et al. | |
| 6,356,485 B1 | 3/2002 | Proebsting et al. | |
| 6,376,876 B1 | 4/2002 | Shin et al. | |
| 6,542,411 B2 | 4/2003 | Tanikawa et al. | |
| 6,614,684 B1 | 9/2003 | Shukuri et al. | |
| 6,653,175 B1 | 11/2003 | Nemati et al. | |
| 6,661,042 B2 | 12/2003 | Hsu | |
| 6,686,624 B2 | 2/2004 | Hsu | |
| 6,724,657 B2 | 4/2004 | Shukuri et al. | |
| 6,773,968 B1 | 8/2004 | Forbes et al. | |
| 6,791,882 B2 | 9/2004 | Seki et al. | |
| 6,801,452 B2 | 10/2004 | Miwa et al. | |
| 6,828,632 B2 | 12/2004 | Bhattacharyya | |
| 6,885,581 B2 | 4/2005 | Nemati et al. | |
| 6,913,964 B2 | 7/2005 | Hsu | |
| 6,925,006 B2 | 8/2005 | Fazan et al. | |
| 6,937,516 B2 | 8/2005 | Fazan et al. | |
| 6,954,377 B2 | 10/2005 | Choi et al. | |
| 6,956,256 B2 | 10/2005 | Forbes | |
| 6,969,662 B2 | 11/2005 | Fazan et al. | |
| 7,023,740 B1 | 4/2006 | Wong et al. | |
| 7,061,806 B2 | 6/2006 | Tang et al. | |
| 7,081,653 B2 | 7/2006 | Kawanaka | |
| 7,085,153 B2 | 8/2006 | Ferrant et al. | |
| 7,085,156 B2 | 8/2006 | Ferrant et al. | |
| 7,118,986 B2 | 10/2006 | Steigerwalt et al. | |
| 7,158,410 B2 | 1/2007 | Bhattacharyya et al. | |
| 7,170,807 B2 | 1/2007 | Fazan et al. | |
| 7,190,616 B2 | 3/2007 | Forbes et al. | |
| 7,212,432 B2 | 5/2007 | Ferrant et al. | |
| 7,224,019 B2 | 5/2007 | Hieda et al. | |
| 7,224,020 B2 | 5/2007 | Wang et al. | |
| 7,259,420 B2 | 8/2007 | Anderson et al. | |
| 7,259,992 B2 | 8/2007 | Shirota | |
| 7,285,820 B2 | 10/2007 | Park et al. | |
| 7,285,832 B2 | 10/2007 | Hoefler et al. | |
| 7,301,803 B2 | 11/2007 | Okhonin et al. | |
| 7,329,580 B2 | 2/2008 | Cho et al. | |
| 7,352,631 B2 | 4/2008 | Burnett et al. | |
| 7,391,640 B2 | 6/2008 | Tang et al. | |
| 7,436,695 B2 | 10/2008 | Nirschl et al. | |
| 7,440,333 B2 | 10/2008 | Hsia et al. | |
| 7,447,068 B2 | 11/2008 | Tsai et al. | |
| 7,450,423 B2 | 11/2008 | Lai et al. | |
| 7,473,611 B2 | 1/2009 | Cho et al. | |
| 7,504,302 B2 | 3/2009 | Matthew et al. | |
| 7,541,636 B2 | 6/2009 | Ranica et al. | |
| 7,542,345 B2 | 6/2009 | Okhonin et al. | |
| 7,579,241 B2 | 8/2009 | Hieda et al. | |
| 7,609,551 B2 | 10/2009 | Shino et al. | |
| 7,622,761 B2 | 11/2009 | Park et al. | |
| 7,683,430 B2 | 3/2010 | Okhonin | |
| 7,733,693 B2 | 6/2010 | Ferrant et al. | |
| 7,759,715 B2 | 7/2010 | Bhattacharyya | |
| 7,760,548 B2 | 7/2010 | Widjaja | |
| 7,847,338 B2 * | 12/2010 | Widjaja | H01L 27/10897 257/315 |
| 7,898,009 B2 | 3/2011 | Wilson et al. | |
| 7,898,848 B2 | 3/2011 | Pirovano et al. | |
| 7,903,472 B2 | 3/2011 | Chen et al. | |
| 7,947,572 B2 | 5/2011 | Park et al. | |
| 7,982,256 B2 | 7/2011 | Huo et al. | |
| 8,014,200 B2 * | 9/2011 | Widjaja | H01L 27/105 365/185.08 |
| 8,036,033 B2 * | 10/2011 | Widjaja | G11C 11/404 365/228 |
| 8,059,459 B2 * | 11/2011 | Widjaja | H01L 29/40114 365/150 |
| 8,159,878 B2 * | 4/2012 | Widjaja | H01L 29/66825 365/185.26 |
| 8,294,193 B2 * | 10/2012 | Widjaja | H01L 29/40114 365/185.26 |
| 8,391,066 B2 | 3/2013 | Widjaja | |
| 8,472,249 B2 | 6/2013 | Widjaja | |

(56) References Cited

U.S. PATENT DOCUMENTS

| | | | |
|---|---|---|---|
| 8,570,803 B2 | 10/2013 | Widjaja | |
| 8,787,085 B2* | 7/2014 | Widjaja | H01L 29/792 365/150 |
| 9,153,333 B2* | 10/2015 | Widjaja | H01L 29/40117 |
| 9,455,262 B2* | 9/2016 | Widjaja | H01L 29/7841 |
| 9,460,790 B2* | 10/2016 | Widjaja | H01L 27/11526 |
| 9,646,693 B2* | 5/2017 | Widjaja | G11C 16/0475 |
| 9,761,311 B2 | 9/2017 | Widjaja | |
| 9,812,203 B2* | 11/2017 | Widjaja | H01L 27/24 |
| 9,928,910 B2* | 3/2018 | Widjaja | G11C 16/02 |
| 9,978,450 B2* | 5/2018 | Widjaja | H01L 27/1052 |
| 10,008,266 B1* | 6/2018 | Widjaja | H01L 27/10802 |
| 10,109,349 B2* | 10/2018 | Widjaja | H01L 29/7841 |
| 10,204,684 B2* | 2/2019 | Widjaja | G11C 11/404 |
| 10,210,934 B2* | 2/2019 | Widjaja | G11C 14/0018 |
| 10,340,006 B2* | 7/2019 | Widjaja | H01L 27/1023 |
| 10,388,378 B2* | 8/2019 | Widjaja | H01L 29/66833 |
| 10,403,361 B2* | 9/2019 | Widjaja | H01L 29/7881 |
| 10,468,102 B2 | 11/2019 | Widjaja | |
| 10,497,443 B2* | 12/2019 | Widjaja | H01L 29/7881 |
| 10,553,281 B2* | 2/2020 | Widjaja | G11C 14/0018 |
| 10,622,069 B2* | 4/2020 | Widjaja | H01L 27/108 |
| 10,734,076 B2* | 8/2020 | Widjaja | H01L 27/1023 |
| 10,818,354 B2* | 10/2020 | Widjaja | G11C 14/0018 |
| 10,825,520 B2* | 11/2020 | Widjaja | G11C 16/0466 |
| 11,011,232 B2* | 5/2021 | Widjaja | G11C 11/56 |
| 2002/0018366 A1 | 2/2002 | von Schwerin et al. | |
| 2002/0048193 A1 | 4/2002 | Tanikawa et al. | |
| 2005/0024968 A1 | 2/2005 | Lee et al. | |
| 2005/0032313 A1 | 2/2005 | Forbes | |
| 2005/0124120 A1 | 6/2005 | Du et al. | |
| 2006/0044915 A1 | 3/2006 | Park et al. | |
| 2006/0125010 A1 | 6/2006 | Bhattacharyya | |
| 2006/0157679 A1 | 7/2006 | Scheuerlein | |
| 2006/0227601 A1 | 10/2006 | Bhattacharyya | |
| 2006/0237770 A1 | 10/2006 | Hunag et al. | |
| 2006/0278915 A1 | 12/2006 | Lee et al. | |
| 2007/0004149 A1 | 1/2007 | Tews | |
| 2007/0090443 A1 | 4/2007 | Choi et al. | |
| 2007/0164351 A1 | 7/2007 | Hamamoto | |
| 2007/0164352 A1 | 7/2007 | Padilla | |
| 2007/0210338 A1 | 9/2007 | Orlowski | |
| 2007/0211535 A1 | 9/2007 | Kim | |
| 2007/0215954 A1 | 9/2007 | Mouli | |
| 2007/0284648 A1 | 12/2007 | Park et al. | |
| 2008/0048239 A1 | 2/2008 | Huo et al. | |
| 2008/0080248 A1 | 4/2008 | Lue et al. | |
| 2008/0123418 A1 | 5/2008 | Widjaja | |
| 2008/0179656 A1 | 7/2008 | Aoki | |
| 2008/0224202 A1 | 9/2008 | Young et al. | |
| 2008/0265305 A1 | 10/2008 | He et al. | |
| 2008/0303079 A1 | 12/2008 | Cho et al. | |
| 2009/0016101 A1 | 1/2009 | Okhonin et al. | |
| 2009/0034320 A1 | 2/2009 | Ueda | |
| 2009/0065853 A1 | 3/2009 | Hanafi | |
| 2009/0081835 A1 | 3/2009 | Kim et al. | |
| 2009/0085089 A1 | 4/2009 | Chang et al. | |
| 2009/0108322 A1 | 4/2009 | Widjaja | |
| 2009/0108351 A1 | 4/2009 | Yang et al. | |
| 2009/0109750 A1 | 4/2009 | Widjaja | |
| 2009/0173985 A1 | 7/2009 | Lee et al. | |
| 2009/0190402 A1 | 7/2009 | Hsu et al. | |
| 2009/0251966 A1 | 10/2009 | Widjaja | |
| 2009/0316492 A1 | 12/2009 | Widjaja | |
| 2010/0008139 A1 | 1/2010 | Bae | |
| 2010/0034041 A1 | 2/2010 | Widjaja | |
| 2010/0046287 A1 | 2/2010 | Widjaja | |
| 2010/0246277 A1 | 9/2010 | Widjaja | |
| 2010/0246284 A1 | 9/2010 | Widjaja | |
| 2011/0032756 A1 | 2/2011 | Widjaja | |
| 2011/0042736 A1 | 2/2011 | Widjaja | |
| 2011/0044110 A1 | 2/2011 | Widjaja | |
| 2011/0228591 A1 | 9/2011 | Widjaja | |
| 2012/0014180 A1 | 1/2012 | Widjaja | |
| 2012/0069652 A1 | 3/2012 | Widjaja | |
| 2013/0148422 A1 | 6/2013 | Widjaja | |
| 2013/0250685 A1 | 9/2013 | Widjaja | |
| 2014/0355343 A1 | 12/2014 | Widjaja | |
| 2015/0371707 A1 | 12/2015 | Widjaja | |
| 2017/0025534 A1 | 1/2017 | Widjaja | |
| 2017/0365340 A1 | 12/2017 | Widjaja | |

OTHER PUBLICATIONS

Campardo et al., VLSI Design of Non-Volatile Memories, ISBN 3-540-20198-X, 2005, pp. 94-95.

Han et al., Programming/Erasing Characteristics of 45 nm NOR-Type Flash Memory Based on SOI FinFet Structure, J Korean Physical Society, vol. 47, Nov. 2005, pp. S564-S567.

Headland, Hot electron injection, Feb. 19, 2004.

Ohsawa et al., Memory Design Using One-Transistor Gain Cell on SOI, Tech. Digest, IEEE International Solid-State Circuits, vol. 37, No. 11, 2002, pp. 1510-1522.

Ohsawa et al., An 18.5ns 128Mb SOI DRAM with a Floating Body Cell, IEEE International Solid State Circuits Conference, 2005, pp. 458-459, 609.

Okhonin et al., A Capacitor-less 1T-DRAM Cell, IEEE Electron Device Letters, vol. 23, No. 2, Feb. 2002, pp. 85-87.

Okhonin et al., A SOI Capacitor-less 1T-DRAM Concept, IEEE International SOI Conference, 2001, pp. 153-154.

Okhonin et al., Principles of Transient Charge Pumping on Partially Depleted SOI MOSFETs, IEE Electron Device letters, vol. 23, No. 5, May 2002, pp. 279-281.

Pelizzer et al., A 90nm Phase Change Memory Technology for Stand-Alone Non-Volatile Memory Applications, 2006 Symposium on VLSI Technology Digest of Technical Papers, 2006, pp. 1-2.

Ranica et al., Scaled 1T-Bulk devices built with CMOS 90nm technology for low-cost eDRAM applications, 2005 Symposium on VLSI Technology Digest of Technical Papers, 2005, pp. 38-39.

Pierret, Semiconductor Device Fundamentals, ISBN: 0-201-54393-1, Addison-Wesley Publishing Company, Inc., 1996, 463-476.

Tack et al., The Multistable Charge-Controlled Memory Effect in SOI Transistors at Low Temperatures, IEEE Transactions on Electron Devices, vol. 37, May 1990, pp. 1373-1382.

Yoshida et al., A Design of a Capacitorless 1T-DRAM Cell Using Gate-Induced Drain Leakage (GIDL) Current for Low-power and High-speed Embedded Memory, International Electron Devices Meeting, 2003, pp. 1-4.

Bawedin et al., "Floating-Body SOI Memory: concepts, Physics, and Challenges", ECS Transactions 19.4 (2009), pp. 243-256.

Chatterjee et al., "Taper isolated dynamic gain RAM cell." Electron Devices Meeting; 1978 international; vol. 24, IEEE, 1978, pp. 698-699.

Chatterjee et al., "Circuit Optimization of the Taper Isolated Dynamic Gain RAM Cell for VLSI Memories." pp. 22-23, 1979 IEEE International Solid-State Circuits Conference.

Chatterjee et al., "A survey of high-density dynamic RAM cell concepts." Electron Devices, IEEE Transactions on, 26.6 (1979): 827-939.

Erb, "Stratified charge memory." Solid-State Circuits Conference; Digest of Technical Papers; 1978 IEEE International; vol. 21, IEEE, 1978, pp. 24-25.

Leiss et al., "dRAM Design Using the Taper-Isolated Dynamic RAM Cell." Solid-State circuits, IEEE Journal of 17.2 (1982): 337-344.

Ranica et al., "A one transistor cell on bulk substrate (1T-Bulk) for low-cost and high density eDRAM." VLSI Technology, 2004. Digest of Technical Papers. 2004 Symposium on; IEEE, 2004, pp. 128-129.

Ohsawa et al., "Autonomous refresh of floating body cell (FBC)." Electron Devices Meeting, 2008, IEDM 2008, IEEE International, IEEE, 2008, pp. 801-804.

Lanyon et al., "Bandgap Narrowing in Moderately to Heavily Doped Silicon", IEEE Trans, on Electron Devices, vol. ED-26, No. 7, 1979, pp. 1014-1018.

Lin et al., "A new 1T Dram Cell with enhanc3ed Floating Body Effect", Proc. of 2006 IEEE International Workshop on Memory Tech., Design and Testing, pp. 1-5, 2006.

(56) References Cited

OTHER PUBLICATIONS

Oh et al., "A 4-Bity Double SONOS Memory (DSM) with 4 Storage Nodes Per Cell for Ultimate Multi-Bit Operation", 2006 Symposium on VLSI Tech. Digest of Tech. Papers, pp. 1-2, 2006.
Rothemund et al., "Teh importance of being modular", Nasture, vol. 485, May 2012, pp. 584-585.
Reisch, "On bistable behavior and open-base breakdown of bipolar transistors in the avalanche regime-modeling and applications." Electron Devices, IEEE Transactions on 39.6 (1992): 1398-1409.
Sakui et al., "A new stataic memory cell based on teh reverse base current effect of bipolar transistors." Electron Devices, IEEE Transactions on 36.6 (1989): 1215-1217.
Sakui et al., "A new static memory cell based on reverse base current (RBC) effect of bipolar transistor." Electron Devices Meeting; 1988, IEDM'88; Technical Digest; Internatioan. IEEE, 1988, pp. 44-47.
Sze et al., Physics of Semiconductor Devices, Wiley Interscience, 2007, p. 104.
Terada et al., "A new VLSI memory cell using capacitance coupling (CC cell)." Electron Devices, IEEE Transactions on 31.9 (1984): pp. 1319-1324.
Villaret et al., "Further insight into the physics and modeling of floating-body capacitorless DRAMs." Electron Devices, EEE Transactions on 52.11 (2005): pp. 2447-2454.

\* cited by examiner

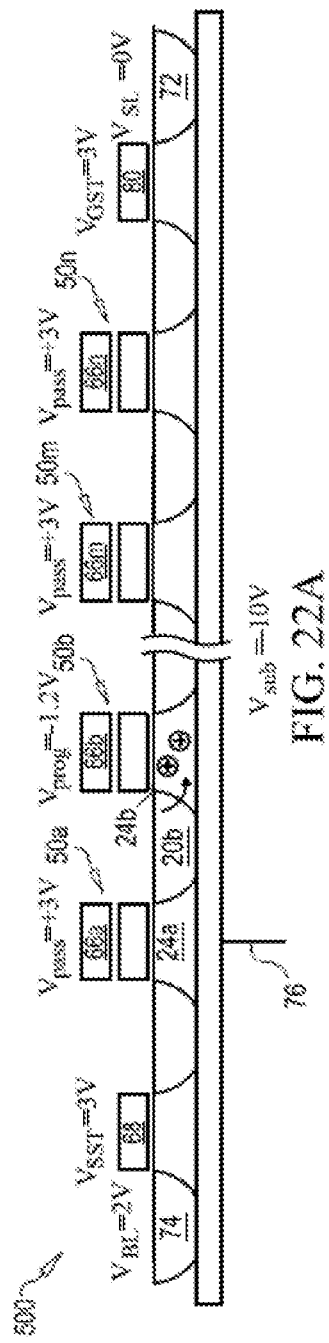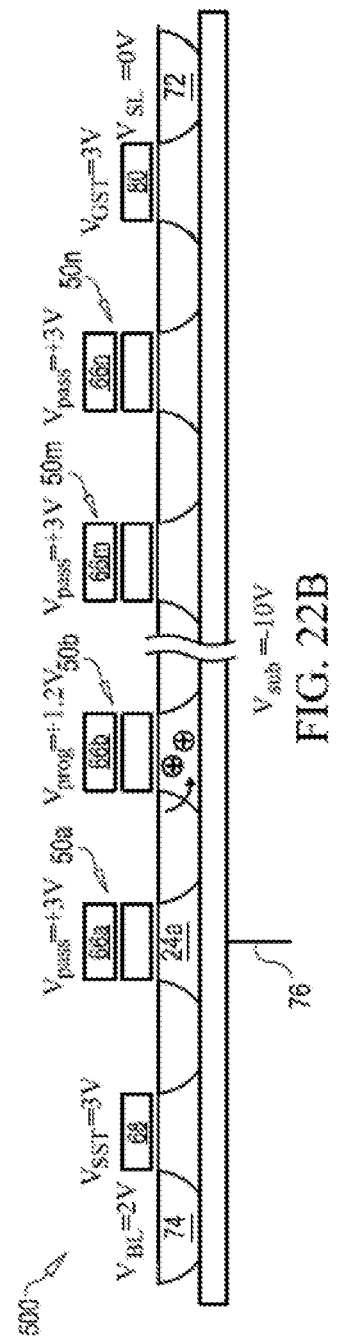

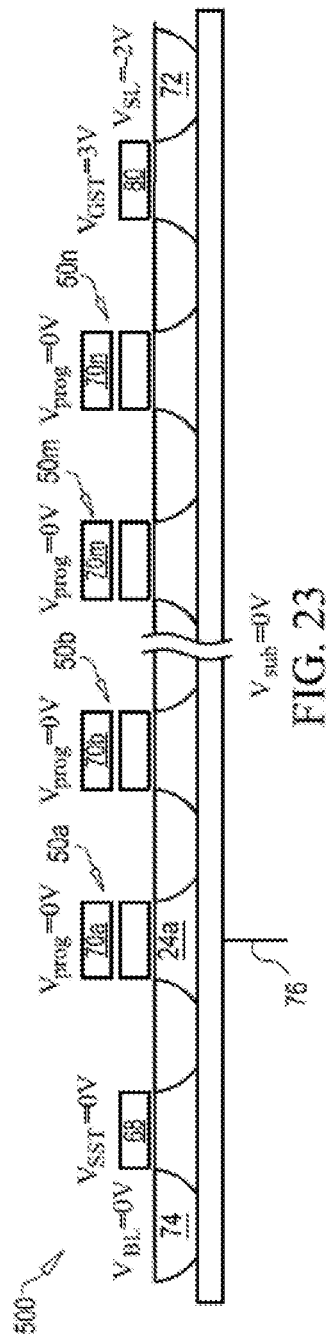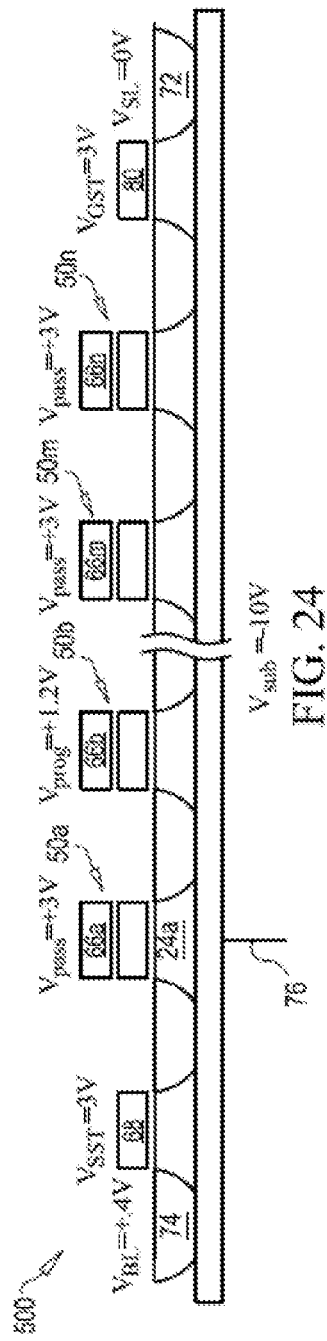

SEMICONDUCTOR MEMORY HAVING BOTH VOLATILE AND NON-VOLATILE FUNCTIONALITY AND METHOD OF OPERATING

CROSS-REFERENCE

This application is a continuation of co-pending application Ser. No. 16/591,858, filed Oct. 03, 2019, which is a continuation of application Ser. No. 15/673,059, filed Aug. 9, 2017, now U.S. Pat. No. 10,468,102, which is a continuation of application Ser. No. 15/267,402, filed Sep. 16, 2016, now U.S. Pat. No. 9,761,311, which is a continuation of application Ser. No. 14/839,682, filed Aug. 28, 2015, now U.S. Pat. No. 9,460,790, which is continuation of application Ser. No. 14/307,424, filed Jun. 17, 2014, now U.S. Pat. No. 9,153,333, which is a division of application Ser. No. 13/903,923, filed May 28, 2013, now U.S. Pat. No. 8,787,085, which is a continuation of application Ser. No. 13/246,582, filed Sep. 27, 2011, now U.S. Pat. No. 8,472,249, which is a divisional application of application Ser. No. 12/257,023, filed Oct. 23, 2008, now U.S. Pat. No. 8,059,459, which claims the benefit of U.S. Provisional Application No. 60/982,382, filed on Oct. 24, 2007 and also claims the benefit of U.S. Provisional Application No. 60/982,374, filed on Oct. 24, 2007. Each of the above Applications (Ser. Nos. 16/591,858; 15/673,059; 15/267,402; 14/839,682; 14/307,424; 13/903,923; 13/246,582; 12/257,023; 60/982,382 and 60/982,374) and U.S. Pat. Nos. 10,468,102; 9,761,311; 9,460,790; 9,153,333; 8,787,085; 8,472,249 and 8,059,459 are hereby incorporated herein, in their entireties, by reference thereto.

This application also hereby incorporates International Application No. PCT/US2007/024544 in its entirety, by reference thereto.

FIELD OF THE INVENTION

The present inventions relates to semiconductor memory technology. More specifically, the present invention relates to semiconductor memory having both volatile and non-volatile semiconductor memory features.

BACKGROUND OF THE INVENTION

Semiconductor memory devices are used extensively to store data. Memory devices can be characterized according to two general types: volatile and non-volatile. Volatile memory devices such as static random access memory (SRAM) and dynamic random access memory (DRAM) lose data that is stored therein when power is not continuously supplied thereto.

Non-volatile memory devices, such as flash erasable programmable read only memory (Flash EPROM) device, retain stored data even in the absence of power supplied thereto. Unfortunately, non-volatile memory devices typically operate more slowly than volatile memory devices. Accordingly, it would be desirable to provide a universal type memory device that includes the advantages of both volatile and non-volatile memory devices, i.e., fast operation on par with volatile memories, while having the ability to retain stored data when power is discontinued to the memory device. It would further be desirable to provide such a universal type memory device having a size that is not prohibitively larger than comparable volatile or non-volatile devices.

SUMMARY OF THE INVENTION

The present invention provides semiconductor memory having both volatile and non-volatile modes and methods of operation of the same.

In at least one embodiment, a method of operating a semiconductor storage device comprising a plurality of memory cells each having a floating body for storing, reading and writing data as volatile memory, and a floating gate or trapping layer for storing data as non-volatile memory is provided, including: reading and storing data to the floating bodies as volatile memory while power is applied to the device; transferring the data stored in the floating bodies, by a parallel, non-algorithmic process, to the floating gates or trapping layers corresponding to the floating bodies, when power to the device is interrupted; and storing the data in the floating gates or trapping layers as non-volatile memory.

In at least one embodiment, the method includes: transferring the data stored in the floating gates or trapping layers, by a parallel, non-algorithmic restore process, to the floating bodies corresponding to the floating gates or trapping layers, when power is restored to the cell; and storing the data in the floating bodies as volatile memory.

In at least one embodiment, the method includes initializing the floating gates or trapping layers, to each have the same predetermined state prior to the transferring.

In at least one embodiment, the predetermined state comprises a positive charge.

In at least one embodiment, the data transferred is stored in the floating gates or trapping layers with charges that are complementary to charges of the floating bodies when storing the data.

In at least one embodiment, the method includes restoring the floating gates or trapping layers to a predetermined charge state after the restore process.

In at least one embodiment, the method includes writing a predetermined state to the floating bodies prior to the transferring the data stored in the floating gates or trapping layers to the floating bodies.

In at least one embodiment, the predetermined state is state "0".

A semiconductor storage device that includes a plurality of memory cells is provided, wherein each memory cell has a floating body for storing, reading and writing data as volatile memory, and a floating gate or trapping layer for storing data as non-volatile memory, the device operating as volatile memory when power is applied to the device, and the device storing data from the volatile memory as non-volatile memory when power to the device is interrupted.

In at least one embodiment, data is transferred from the volatile memory to the non-volatile memory by a parallel, non-algorithmic mechanism.

In at least one embodiment, the device is configured to transfer data stored in non-volatile memory to store the data in the volatile memory when power is restored to the device.

In at least one embodiment, the data is transferred from the non-volatile memory to the volatile memory by a parallel, non-algorithmic mechanism.

In at least one embodiment, the memory cells function as multi-level cells.

A memory string comprising a plurality of semiconductor memory cells connected in series is provided, each semiconductor memory cell comprising: a floating substrate region having a first conductivity type; first and second regions each having a second conductivity type and interfacing with the floating substrate region, such that at least a portion of the floating substrate region is located between the first and second regions and functions to store data in volatile memory; a floating gate it trapping layer positioned in between the first and second regions, adjacent a surface of the floating substrate region and insulated from the floating substrate region by an insulating layer; the floating gate or trapping layer being configured to receive transfer of data stored by the volatile memory and store the data as non-volatile memory in the floating gate or trapping layer upon interruption of power to the memory cell; a control gate positioned adjacent the floating gate or trapping layer; and a second insulating layer between the floating gate or trapping layer and the control gate.

In at least one embodiment, the semiconductor memory cells are substantially planar.

In at least one embodiment, the semiconductor memory cells comprise three-dimensional cells, each having a fin extending from a substrate.

In at least one embodiment, a string selection transistor is connected to one end of the plurality of semiconductor memory cells connected in series, and a ground selection transistor is connected to an opposite end the plurality of semiconductor memory cells connected in series.

In at least one embodiment, the semiconductor memory cells function as multi-level cells.

A memory cell device including a plurality of memory strings assembled to form a grid of semiconductor memory cells is provided, each of the memory strings comprising a plurality of semiconductor memory cells connected in series, each semiconductor memory cell comprising: a floating substrate region having a first conductivity type; first and second regions each having a second conductivity type and interfacing with said floating substrate region, such that at least a portion of the floating substrate region is located between the first and second regions and functions to store data in volatile memory; a floating gate or trapping layer positioned in between the first and second regions, adjacent a surface of the floating substrate region and insulated from the floating substrate region by an insulating layer; the floating gate or trapping layer being configured to receive transfer of data stored by the volatile memory and store the data as nonvolatile memory in the floating gate or trapping layer upon interruption of power to the memory cell; a control gate positioned adjacent the floating gate or trapping layer; and a second insulating layer between the floating gate or trapping layer and the control gate.

In at least one embodiment, the memory strings form columns of the grid.

In at least one embodiment, the columns are insulated from one another by insulating members placed between the columns.

In at least one embodiment, the semiconductor memory cells function as multi-level cells.

These and other features of the invention will become apparent to those persons skilled in the art upon reading the details of the devices and methods as more fully described below.

BRIEF DESCRIPTION OF THE DRAWINGS

FIGS. 22A and 22B illustrate alternative write state "1" operations that can be carried out on the string of FIG. 20.

FIG. 23 illustrates a write state "0" operation on the string of FIG. 20.

FIG. 24 illustrates a read operation on the string of FIG. 20.

DETAILED DESCRIPTION OF THE INVENTION

Figure 1:
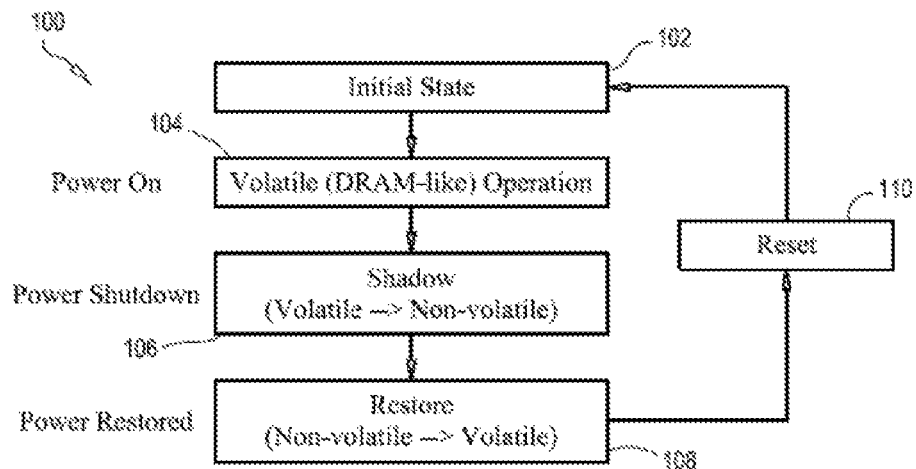
FIG. 1 is a flowchart illustrating operation of a non-volatile memory device according to the present invention.

Before the present devices and methods are described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "an", and "the" include plural referents unless the context clearly dictates otherwise. Thus, for example, reference to "a device" includes a plurality of such devices and reference to "the transistor" includes reference to one or more transistors and equivalents thereof known to those skilled in the art, and so forth.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed.

Definitions

The terms "shadowing" "shadowing operation" and "shadowing process" refer to a process of copying the content of volatile memory to non-volatile memory.

"Restore", "restore operation", or "restore process", as used herein, refers to a process of copying the content of non-volatile memory to volatile memory.

"Reset", "reset operation", or "reset process", as used herein, refers to a process of setting non-volatile memory to a predetermined state following a restore process, or when otherwise setting the non-volatile memory to an initial state (such as when powering up for the first time, prior to ever storing data in the non-volatile memory, for example).

FIG. 1 is a flowchart 100 illustrating operation of a memory device according to the present invention. At event 102, when power is first applied to the memory device, the memory device is placed in an initial state, in a volatile operational mode and the nonvolatile memory is set to a predetermined state, typically set to have a positive charge. At event 104 the memory device of the present invention operates in the same manner as a conventional DRAM memory cell, i.e., operating as volatile memory. However, during power shutdown, or when power is inadvertently lost, or any other event that discontinues or upsets power to the memory device of the present invention, the content of the volatile memory is loaded into non-volatile memory at event 106, during a process which is referred to here as "shadowing" (event 106), and the data held in volatile memory is lost. Shadowing can also be performed during backup operations, which may be performed at regular intervals during DRAM operation 104 periods, and/or at any time that a user manually instructs a backup. During a backup operation, the content of the volatile memory is copied to the non-volatile memory while power is maintained to the volatile memory so that the content of the volatile memory also remains in volatile memory. Alternatively, because the volatile memory operation consumes more power than the non-volatile storage of the contents of the volatile memory, the device can be configured to perform the shadowing process anytime the device has been idle for at least a predetermined period of time, thereby transferring the contents of the volatile memory into non-volatile memory and conserving power. As one example, the predetermined time period can be about thirty minutes, but of course, the invention is not limited to this time period, as the device could be programmed with virtually any predetermined time period.

After the content of the volatile memory has been moved during a shadowing operation to nonvolatile memory, the shutdown of the memory device occurs, as power is no longer supplied to the volatile memory. At this time, the memory device functions like a Flash EPROM device in that it retains the stored data in the nonvolatile memory. Upon restoring power at event 108, the content of the nonvolatile memory is restored by transferring the content of the non-volatile memory to the volatile memory in a process referred to herein as the "restore" process, after which, upon resetting the memory device at event 110, the memory device is again set to the initial state (event 102) and again operates in a volatile mode, like a DRAM memory device, event 104.

The present invention thus provides a memory device which combines the fast operation of volatile memories with the ability to retain charge that is provided in nonvolatile memories. Further, the data transfer from the volatile mode to the non-volatile mode and vice versa, operate in parallel by a non-algorithmic process described below, which greatly enhances the speed of operation of the storage device. As one non-limiting practical application of use of a memory device according to the present invention, a description of operation of the memory device in a personal computer follows. This example is in no way intended to limit the applications in which the present invention may be used, as there are many applications, including, but not limited to: cell phones, laptop computers, desktop computers, kitchen appliances, land line phones, electronic gaming, video games, personal organizers, mp3 and other electronic forms of digital music players, and any other applications, too numerous to mention here, that use digital memory. In use, the volatile mode provides a fast access speed and is what is used during normal operations (i.e., when the power is on to the memory device). In an example of use in a personal computer (PC), when the power to the PC is on (i.e., the PC is turned on), the memory device according to the present invention operates in volatile mode. When the PC is shut down (i.e., power is turned off), the memory content of the volatile memory is shadowed to the non-volatile memory of the memory device according to the present invention. When the PC is turned on again (power is turned on), the memory content is restored from the non-volatile memory to the volatile memory. A reset process is then conducted on the non-volatile memory so that its data does not interfere with the data having been transferred to the volatile memory.

Figure 2:
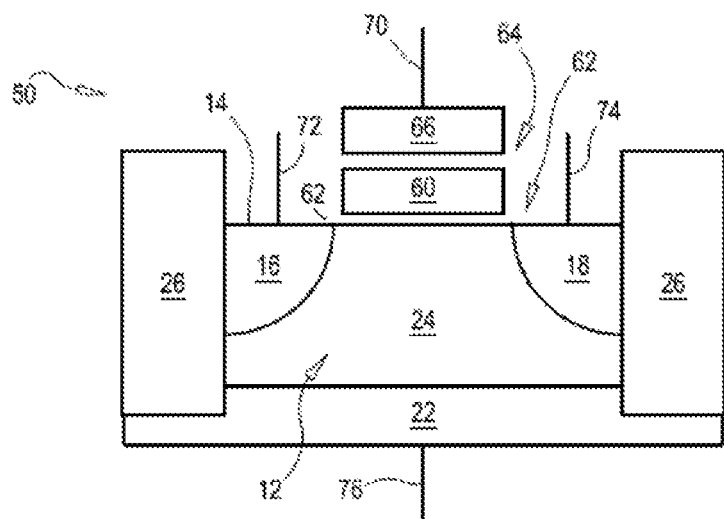
FIG. 2 schematically illustrates an embodiment of a memory cell according to the present invention.

FIG. 2 schematically illustrates an embodiment of a memory cell 50 according to the present invention. The cell 50 includes a substrate 12 of a first conductivity type, such as a p-type conductivity type, for example. Substrate 12 is typically made of silicon, but may comprise germanium, silicon germanium, gallium arsenide, carbon nanotubes, or other semiconductor materials known in the art. The substrate 12 has a surface 14. A first region 16 having a second conductivity type, such as n-type, for example, is provided in substrate 12 and which is exposed at surface 14. A second region 18 having the second conductivity type is also provided in substrate 12, which is exposed at surface 14 and which is spaced apart from the first region 16. First and second regions 16 and 18 are formed by an implantation process formed on the material making up substrate 12, according to any of implantation processes known and typically used in the art.

A buried layer 22 of the second conductivity type is also provided in the substrate 12, buried in the substrate 12, as shown. Region 22 is also formed by an ion implantation process on the material of substrate 12. A body region 24 of the substrate 12 is bounded by surface 14, first and second regions 16,18 and insulating layers 26 (e.g. shallow trench isolation (STI)), which may be made of silicon oxide, for example. Insulating layers 26 insulate cell 50 from neighboring cells 50 when multiple cells 50 are joined to make a memory device. A floating gate or trapping layer 60 is positioned in between the regions 16 and 18, and above the surface 14. Trapping layer/floating gate 60 is insulated from surface 14 by an insulating layer 62. Insulating layer 62 max be made of silicon oxide and/or other dielectric materials, including high "K" dielectric materials, such as, but not limited to, tantalum peroxide, titanium oxide, zirconium oxide, hafnium oxide, and/or aluminum oxide. Floating gate/trapping layer 60 may be made of polysilicon material. If a trapping layer is chosen, the trapping layer may be made from silicon nitride or silicon nanocrystal, etc. Whether a floating gate 60 or a trapping layer 60 is used, the function is the same, in that they hold data in the absence of power. The primary difference between the floating gate 60 and the trapping layer 60 is that the floating gate 60 is a conductor, while the trapping layer 60 is an insulator layer. Thus, typically one or the other of trapping layer 60 and floating gate 60 are employed in device 50, but not both.

A control gate 66 is positioned above floating gate/trapping layer 60 and insulated therefrom by insulating layer 64 such that floating gate/trapping layer 60 is positioned between insulating layer 62 and surface 14 underlying floating gate/trapping layer 60, and insulating layer 64 and control gate 66 positioned above floating gate/trapping layer 60, as shown. Control gate 66 is capacitively coupled to floating gate/trapping layer 60. Control gate 66 is typically made of polysilicon material or metal gate electrode, such as tungsten, tantalum, titanium and their nitrides. The relationship between the floating gate/trapping layer 60 and control gate 66 is similar to that of a nonvolatile stacked gate floating gate, trapping layer memory cell. The floating gate/trapping layer 60 functions to store non-volatile memory data and the control gate 66 is used for memory cell selection.

Cell 50 includes four terminals: word line (WL) terminal 70, source line (SL) terminal 72, bit line (BL) terminal 74 and buried well (BW) terminal 76. Terminal 70 is connected to control gate 66. Terminal 72 is connected to first region 16 and terminal 74 is connected to second region 18. Alternatively, terminal 72 can be connected to second region 18 and terminal 74 can be connected to first region 16. Terminal 76 is connected to buried layer 22.

When power is applied to cell 50, cell 50 operates like a currently available capacitorless DRAM cell. In a capacitorless DRAM device, the memory information (i.e., data that is stored in memory) is stored as charge in the floating body of the transistor, i.e., in the body 24 of cell 50. The presence of the electrical charge in the floating body 24 modulates the threshold voltage of the cell 50, which determines the state of the cell 50.

Figure 3A:
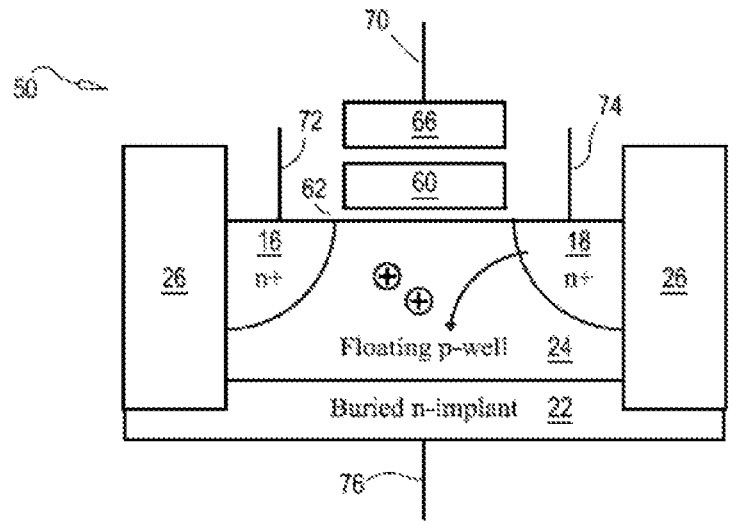
FIGS. 3A-3B illustrate alternative write state "1" operations that can be carried out on a memory cell according to the present invention.
Figure 3B:
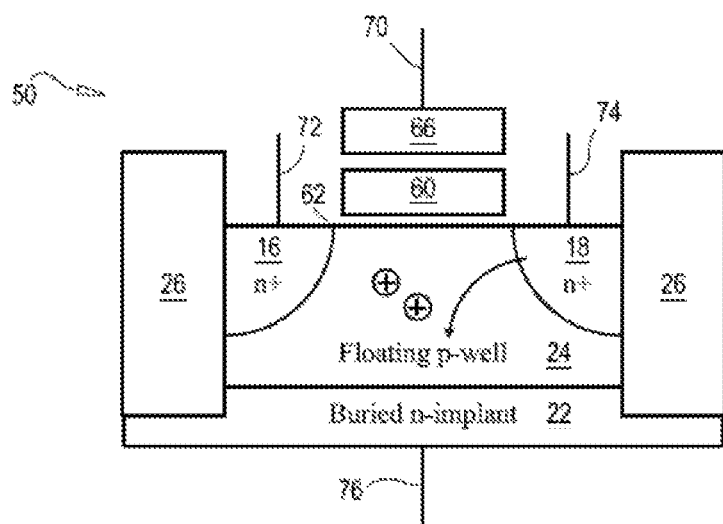

FIGS. 3A-3B illustrate alternative write state "1" operations that can be carried out on cell 50, by performing band-to-band tunneling hot hole injection (FIG. 3A) or impact ionization hot hole injection (FIG. 3B). In alternative embodiments, electrons can be transferred, rather than holes. In FIG. 3A, to write a state "1" into the floating body region 24, a substantially neutral voltage is applied to SL terminal 72, a positive voltage is applied to BL terminal 74, a negative voltage is applied to WL terminal 70 and a positive voltage less than the positive voltage applied to the BL terminal 74 is applied to BW terminal 76. Under these conditions, holes are injected from BL terminal 76 into the floating body region 24, leaving the body region 24 positively charged. In one particular non-limiting embodiment, a charge of about 0.0 volts is applied to terminal 72, a charge of about +2.0 volts is applied to terminal 74, a charge of about −1.2 volts is applied to terminal 70, and a charge of about +0.6 volts is applied to terminal 76. However, these voltage levels may vary, while maintaining the relative relationships between the charges applied, as described above. For example, voltage applied to terminal 72 may be in the range of about 0.0 volts to about +0.4 volts, voltage applied to terminal 74 may be in the range of about +1.5 volts to about +3.0 volts, voltage applied to terminal 70 may be in the range of about 0.0 volts to about −3.0 volts, and voltage applied to terminal 76 may be in the range of about 0.0 volts to about +1.0 volts. Further, the voltages applied to terminals 72 and 74 may be reversed, and still obtain the same result, e.g., a positive voltage applied to terminal 72 and a neutral charge applied to terminal 74.

Alternatively, as illustrated in FIG. 3B, to write a state "1" into the floating body region 24, a substantially neutral voltage is applied to SL terminal 72, a positive voltage is applied to BL terminal 74, a positive voltage less positive than the positive voltage applied to terminal 72 is applied to WL terminal 70 and a positive voltage less positive than the positive voltage applied to terminal 74 is applied to BW terminal 76. Under these conditions, holes are injected from BL terminal 74 into the floating body region 24, leaving the body region 24 positively charged. In one particular non-limiting embodiment, about 0.0 volts is applied to terminal 72, about +2.0 volts is applied to terminal 74, about +1.2 volts is applied to terminal 70, and about +0.6 volts is applied to terminal 76. However, these voltage levels may vary, while maintaining the relative relationships between the charges applied, as described above. For example, voltage applied to terminal 72 may be in the range of about 0.0 volts to about +0.6 volts, voltage applied to terminal 74 may be in the range of about +1.5 volts to about +3.0 volts, voltage applied to terminal 70 may be in the range of about 0.0 volts to about +1.6 volts, and voltage applied to terminal 76 may be in the range of about 0.0 volts to about 1.0 volts. Further, the voltages applied to terminals 72 and 74 may be reversed, and still obtain the same result, e.g., a positive voltage applied to terminal 72 and a neutral charge applied to terminal 74.

Figure 4:
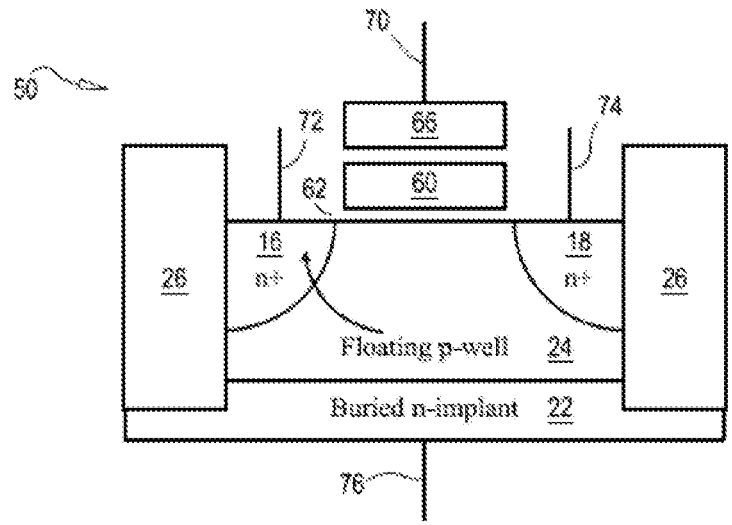
FIG. 4 illustrates a write state "0" operation that can be carried out on a memory cell according to the present invention.

FIG. 4 illustrates a write state "0" operation that can be carried out on cell 50. To write a state "0" into floating body region 24, a negative voltage is applied to SL terminal 72, a substantially neutral voltage is applied to BL terminal 74, a negative voltage less negative than the negative voltage applied to terminal 72 is applied to WL terminal 70 and a positive voltage is applied to BW terminal 76. Under these conditions, the p-n junction (junction between 24 and 16 and between 24 and 18) is forward-biased, evacuating any holes from the floating body 24. In one particular non-limiting embodiment, about −2.0 volts is applied to terminal 72, about 0.0 volts is applied to terminal 74, about −1.2 volts is applied to terminal 70, and about +0.6 volts is applied to terminal 76. However, these voltage levels may vary, while maintaining the relative relationships between the charges applied, as described above. For example, voltage applied to terminal 72 may be in the range of about −1.0 volts to about −3.0 volts, voltage applied to terminal 74 may be in the range of about −1.0 volts to about −3.0 volts, voltage applied to terminal 70 may be in the range of about 0.0 volts to about −3.0 volts, and voltage applied to terminal 76 may be in the range of about 0.0 volts to about 1.0 volts. Further, the voltages applied to terminals 72 and 74 max be reversed, and still obtain the same result, e.g., a substantially neutral voltage applied to terminal 72 and a negative charge applied to terminal 74.

Figure 5:
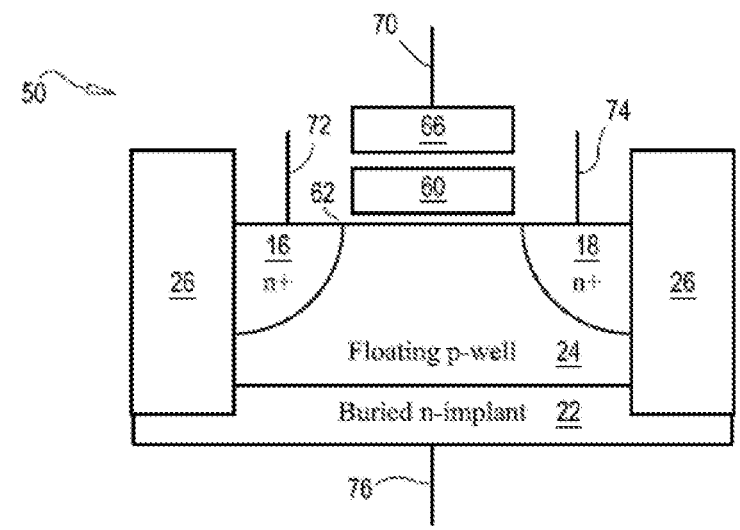
FIG. 5 illustrates a read operation that can be carried out on a memory cell according to the present invention.

A read operation of the cell 50 is now described with reference to FIG. 5. To read cell 50, a substantially neutral charge volts is applied to SL terminal 72, a positive voltage is applied to BL terminal 74, a positive voltage that is more positive than the positive voltage applied to terminal 74 is applied to WL terminal 70 and a positive voltage that is less than the positive voltage applied to terminal 70 is applied to BW terminal 76. If cell 50 is in a state "1" having holes in the body region 24, then a lower threshold voltage (gate voltage where the transistor is turned on) is observed compared to the threshold voltage observed when cell 50 is in a state "0" having no holes in body region 24. In one particular non-limiting embodiment, about 0.0 volts is applied to terminal 72, about +0.4 volts is applied to terminal 74, about +1.2 volts is applied to terminal 70, and about +0.6 volts is applied to terminal 76. However, these voltage levels may vary, while maintaining the relative relationships between the charges applied, as described above. For example, terminal 72 is grounded and is thus at about 0.0 volts, voltage applied to terminal 74 may be in the range of about +0.1 volts to about +1.0 volts, voltage applied to terminal 70 may be in the range of about +1.0 volts to about +3.0 volts, and voltage applied to terminal 76 may be in the range of about 0.0 volts to about 1.0 volts. Further, the voltages applied to terminals 72 and 74 may be reversed, and still obtain the same result, e.g., a positive voltage applied to terminal 72 and a neutral charge applied to terminal 74.

Figure 6A:
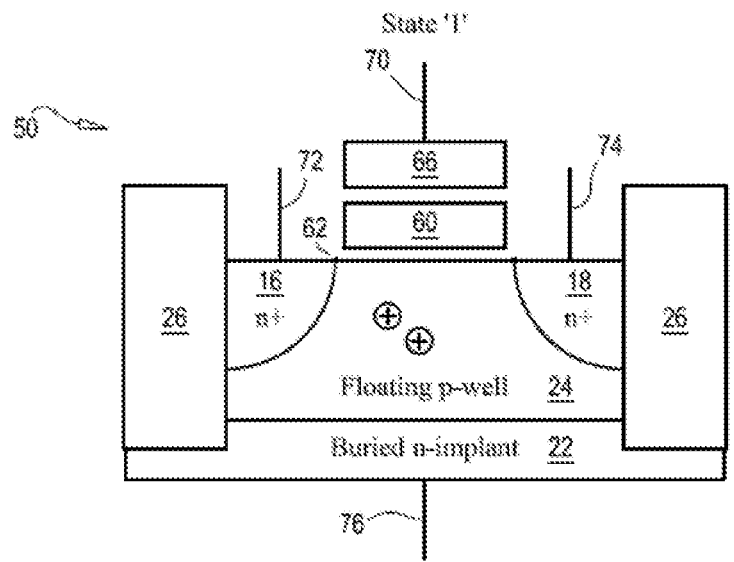
FIGS. 6A and 6B illustrate shadowing operations according to the present invention.
Figure 6B:
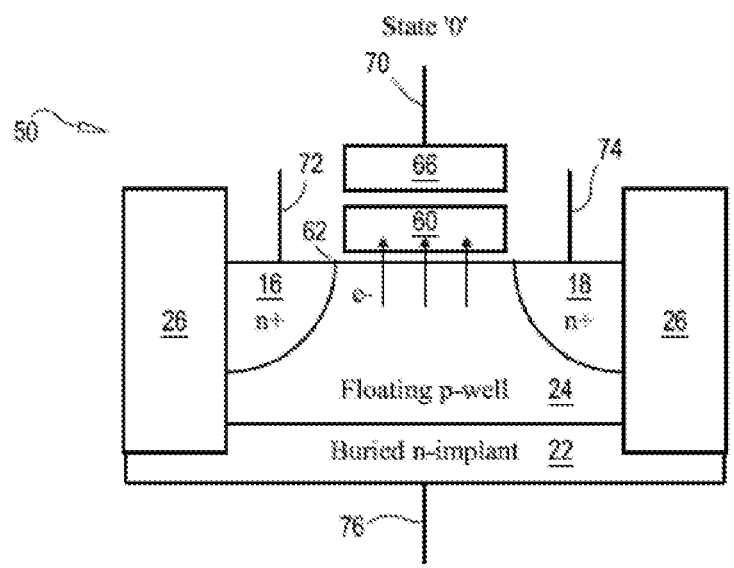

When power down is detected, e.g., when a user turns off the power to cell 50, or the power is inadvertently interrupted, or for any other reason, power is at least temporarily discontinued to cell 50, data stored in the floating body region 24 is transferred to floating gate/trapping layer 60. This operation is referred to as "shadowing" and is described with reference to FIGS. 6A and 6B. To perform the shadowing operation, both SL terminal 72 and BL terminal 74 are left floating (i.e., not held to any specific voltage, but allowed to float to their respective voltages). A high positive voltage (e.g., about +18 volts) is applied to WL terminal 70 and a low positive voltage (e.g., about +0.6 volts) is applied to BW terminal 76. If cell 50 is in a state "1" as illustrated in FIG. 6A, thus having holes in body region 24, a lower electric field between the floating gate/trapping layer 60 and the floating body region 24 is observed in comparison to the electric field observed between the floating gate/trapping layer 60 and the floating body region 24 when cell 50 is in a state "0" as illustrated in FIG. 6B.

The high electric field between the floating gate/trapping layer region 60 and the floating body region 24, when floating body 24 is at state "0" causes electrons to tunnel from floating body 24 to floating gate/trapping layer 60 and the floating gate/trapping layer 60 thus becomes negatively charged. Conversely, the relatively lower electric field existent between the floating gate/trapping layer region 60 and floating body 24 when cell 50 is in the state "1" is not sufficient to cause electron tunneling from the floating body 24 to floating gate/trapping layer 60 and therefore floating gate/trapping layer 60 does not become negatively charged in this situation.

In one particular non-limiting embodiment, terminals 72 and 74 are allowed to float, about +18 volts is applied to terminal 70, and about +0.6 volts is applied to terminal 76. However, these voltage levels may vary, while maintaining the relative relationships between the charges applied, as described above. For example, voltage applied to terminal 70 may be in the range of about +12.0 volts to about +20.0 volts, and voltage applied to terminal 76 may be in the range of about 0.0 volts to about 1.0 volts.

Figure 7A:
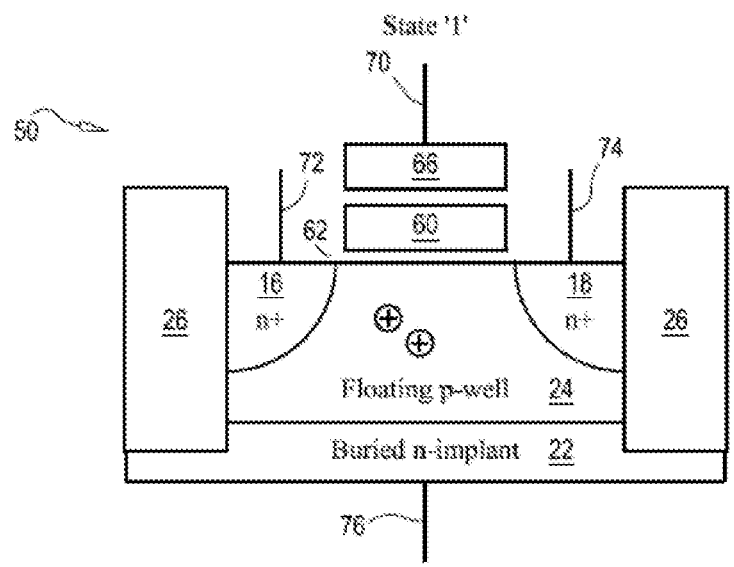
FIGS. 7A and 7B illustrate restore operations according to the present invention.
Figure 7B:
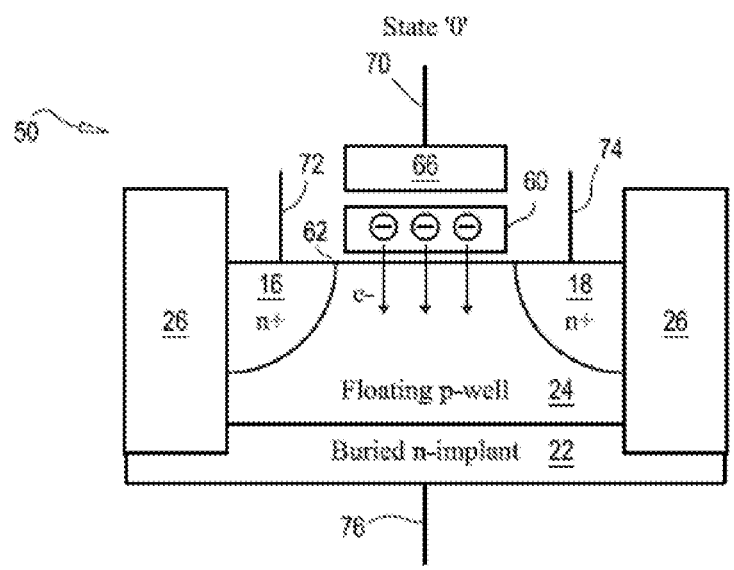

When power is restored to cell 50, the state of the cell 50 as stored on floating gate/trapping layer 60 is restored into floating body region 24. The restore operation (data restoration from non-volatile memory to volatile memory) is described with reference to FIGS. 7A and 7B. Prior to the restore operation/process, the floating body 24 is set to a positive charge, i.e., a "1" state is written to floating body 24. In one embodiment, to perform the restore operation, both SL terminal 72 and BL terminal 74 are left floating. A large negative voltage is applied to WL terminal 70 and a low positive voltage is applied to BW terminal 76. If the floating gate/trapping layer 60 is not negatively charged, no electrons will tunnel from floating gate/trapping layer 60 to floating body 24, and cell 50 will therefore be in a state "1". Conversely, if floating gate/trapping layer 60 is negatively charged, electrons tunnel from floating gate/trapping layer 60 into floating body 24, thereby placing cell 50 in a state "0". In one particular non-limiting embodiment, about −18.0 volts is applied to terminal 70, and about +0.6 volts is applied to terminal 76. However, these voltage levels may vary, while maintaining the relative relationships between the charges applied, as described above. For example, voltage applied to terminal 70 may be in the range of about −12.0 volts to about −20.0 volts, and voltage applied to terminal 76 may be in the range of about 0.0 volts to about +1.0 volts.

Note that this process occurs non-algorithmically, as the state of the floating gate/trapping layer 60 does not have to be read, interpreted, or otherwise measure to determine what state o restore the floating body 24 to. Rather, the restoration process occurs automatically, driven by electrical potential differences. Accordingly, this process is orders of magnitude faster than one that requires algorithmic intervention. Similarly, it is noted that the shadowing process also is performed as a non-algorithmic process. From these operations, it has been shown that cell 50 provides a memory cell having the advantages of a DRAM cell, but where non-volatility is also achieved.

FIGS. 8A-8D illustrate another embodiment of operation of cell 50 to perform a volatile to non-volatile shadowing process, which operates by a hot electron injection process, in contrast to the tunneling process (e.g., Fowler-Nordheim tunneling process) described above with regard to FIGS. 6A-6B. FIG. 8E illustrates the operation of an NPN bipolar device 90, as it relates to the operation of cell 50. Floating body 24 is represented by the terminal to which voltage $V_{FB}$ is applied in FIG. 8E, and the terminals 72 and 74 are represented by terminals to which voltages $V_{SL}$ and $V_{BL}$ are applied, respectively. When $V_{FB}$ is a positive voltage, this turns or the bipolar device 90, and when $V_{FB}$ is a negative or neutral voltage, the device 90 is turned off. Likewise, when floating body 24 has a positive voltage, this turns on the cell 50 so that current flows through the NPN junction formed by 16, 24 and 18 in the direction indicated by the arrow in floating body 24 in FIG. 8A, and when floating body 24 has a negative or neutral voltage, cell is turned off, so that there is no current flow through the NPN junction.

Figure 8A:
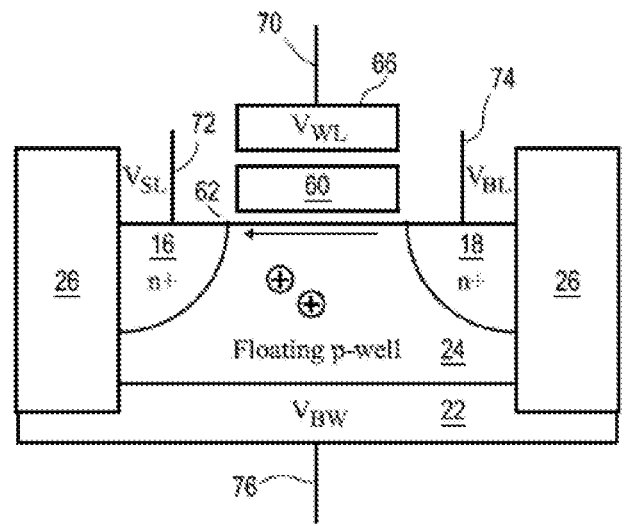
FIGS. 8A-8D illustrate another embodiment of operation of a memory cell to perform volatile to non-volatile shadowing according to the present invention.
Figure 8B:
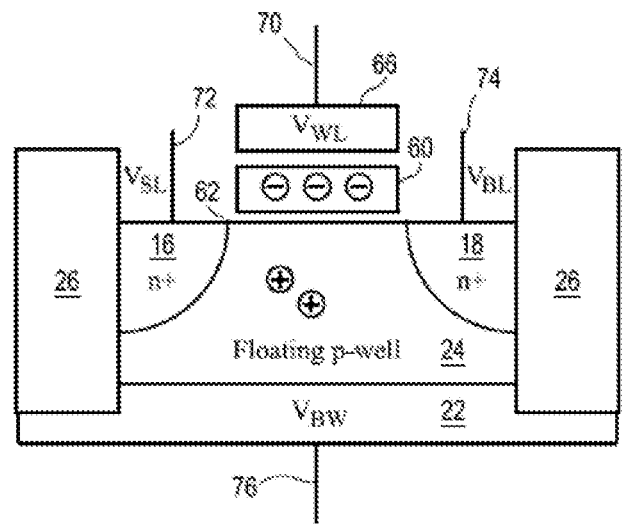

To perform a shadowing process according to the embodiment described with regard to FIGS. 8A-8D, a high positive voltage is applied to terminal 72 and a substantially neutral voltage is applied to terminal 74. Alternatively, a high positive voltage can be applied to terminal 74 and a substantially neutral voltage can be applied to terminal 72. A positive voltage is applied to terminal 70 and a low voltage is applied to terminal 76. A high voltage in this case is a voltage greater than or equal to about +3 volts. In one example, a voltage in the range of about +3 to about +6 volts is applied, although it is possible to apply a higher voltage. The floating gate/trapping layer 60 will have been previously initialized or reset to have a positive charge prior to the operation of the cell 50 to store data in non-volatile memory via floating body 24. When floating body 24 has a positive charge/voltage, the NPN junction is on, as noted above, and electrons flow in the direction of the arrow shown in the floating body 24 in FIG. 8A. The application of the high voltage to terminal 72 at 16 energizes/accelerates electrons traveling through the floating body 24 to a sufficient extent that they can "jump over" the oxide barrier between floating body 24 and floating gate/trapping layer 60, so that electrons enter floating gate/trapping layer 60 as indicated by the arrow into floating gate/trapping layer 60 in FIG. 8A. Accordingly, floating gate/trapping layer 60 becomes negatively charged by the shadowing process, when the volatile memory of cell 50 is in state "1" (i.e., floating body 24 is positively charged), as shown in FIG. 8B.

Figure 8C:
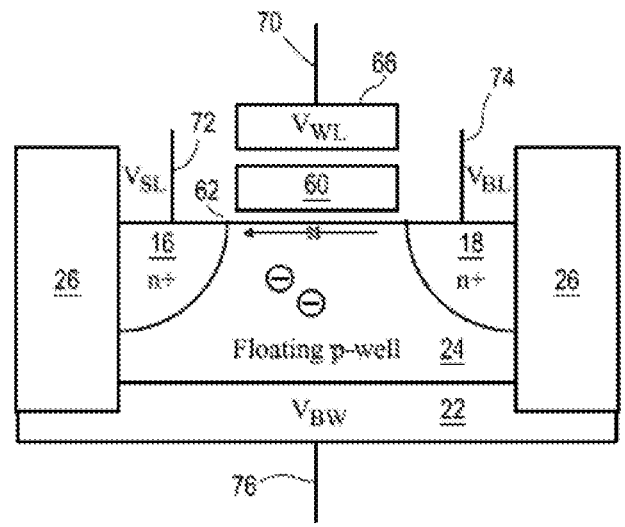
Figure 8D:
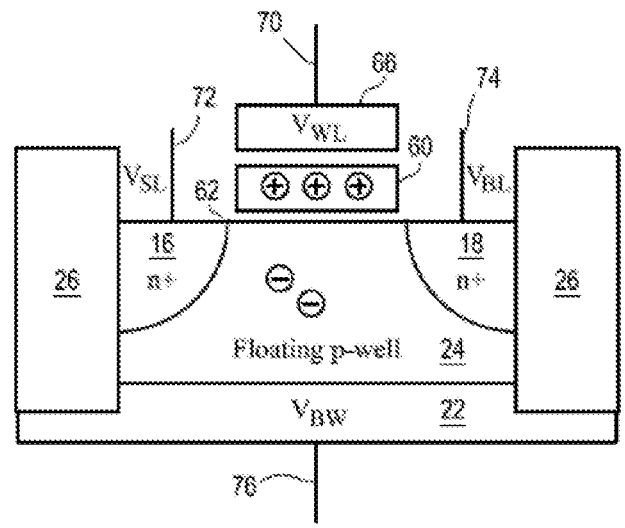
Figure 8E:
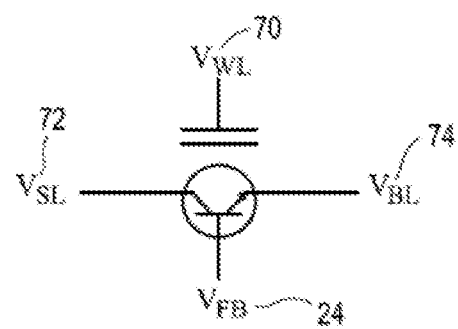
FIG. 8E illustrates the operation of an NPN bipolar device.

When volatile memory of cell 50 is in state "0", i.e., floating body 24 has a negative or neutral charge/voltage, the NPN junction is off, as noted above, and electrons do not flow in the floating body 24, as illustrated in FIG. 8C. Accordingly, when voltages are applied to the terminals as described above, in order to perform the shadowing process, the high positive voltage applied to terminal 72 does not cause an acceleration of electrons in order to cause hot electron injection into floating gate/trapping layer 60, since the electrons are not flowing. Accordingly, floating gate/trapping layer 60 retains its positive charge at the end of the shadowing process, when the volatile memory of cell 50 is in state "0" (i.e., floating body 24 is neutral or negatively charged), as shown in FIG. 8D. Note that the charge state of the floating gate/trapping layer 60 is complementary to the charge state of the floating body 24 after completion of the shadowing process. Thus, if the floating body 24 of the memory cell 50 has a positive charge in volatile memory, the floating gate/trapping layer 60 will become negatively charged by the shadowing process, whereas if the floating body of the memory cell 50 has a negative or neutral charge in volatile memory, the floating gate/trapping layer 60 will be positively charged at the end of the shadowing operation.

The charges/states of the floating gates/trapping layers 60 are determined non-algorithmically by the states of the floating bodies, and shadowing of multiple cells occurs in parallel, therefore the shadowing process is very fast.

In one particular non-limiting example of the shadowing process according to this embodiment, about +3 volts are applied to terminal 72, about 0 volts are applied to terminal 74, about +1.2 volts are applied to terminal 70, and about +0.6 volts are applied to terminal 76. However, these voltage levels may vary, while maintaining the relative relationships between the charges applied, as described above. For example, voltage applied to terminal 72 may be in the range of about +3 volts to about +6 volts, the voltage applied to terminal 74 may be in the range of about 0.0 volts to about +0.4 volts, the voltage applied to terminal 70 may be in the range of about 0.0 volts to about +1.6 volts, and voltage applied to terminal 76 may be in the range of about 0.0 volts to about +1.0 volts.

Figure 9A:
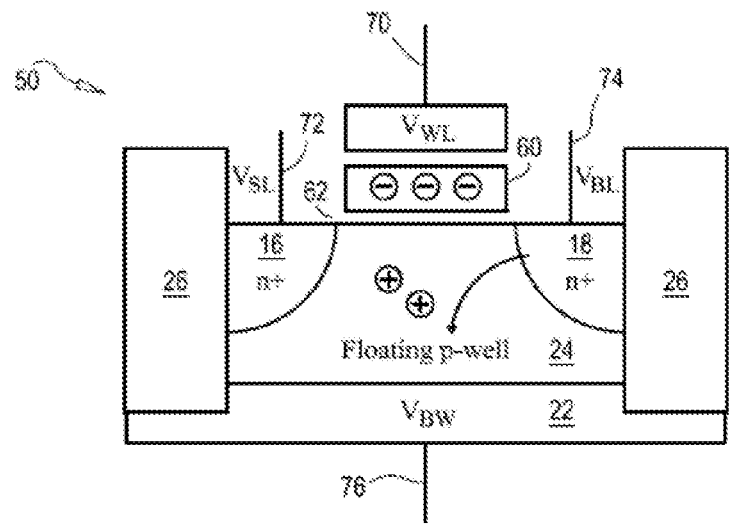
FIGS. 9A-9B illustrate another embodiment of operation of a memory cell to perform a restore process from non-volatile to volatile memory according to the present invention.
Figure 9B:
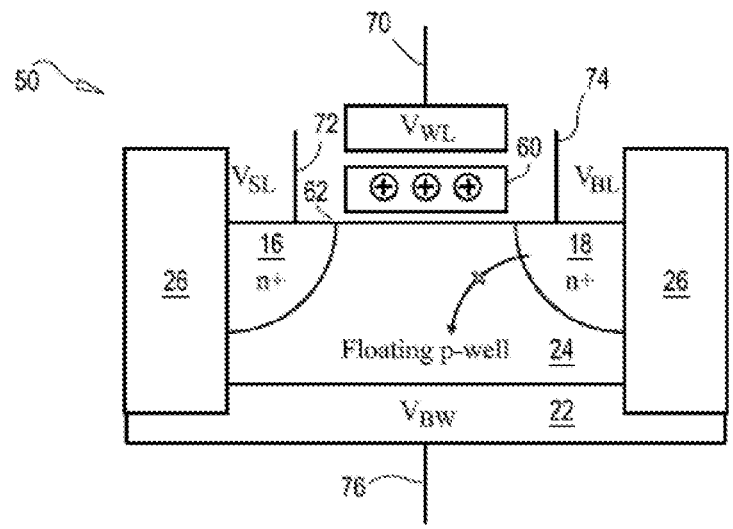

Turning now to FIGS. 9A-9B, another embodiment of operation of cell 50 to perform a restore process from non-volatile to volatile memory is schematically illustrated, in which the restore process operates by a band-to-band tunneling hot hole injection process (modulated by the floating gate/trapping layer 60 charge), in contrast to the electron tunneling process described above with regard to FIGS. 7A-7B. In the embodiment illustrated in FIGS. 9A-9B, the floating body 24 is set to a neutral or negative charge prior to the performing the restore operation/process, i.e., a "0" state is written to floating body 24. In the embodiment of FIGS. 9A-9B, to perform the restore operation, terminal 72 is set to a substantially neutral voltage, a positive voltage is applied to terminal 74, a negative voltage is applied to terminal 70 and a positive voltage that is less positive than the positive voltage applied to terminal 74 is applied to terminal 76. If the floating gate/trapping layer 60 is negatively charged, as illustrated in FIG. 9A, this negative charge enhances the driving force for the band-to-band hot hole injection process, whereby holes are injected from live n-region 18 into floating body 24, thereby restoring the "1" state that the volatile memory cell 50 had held prior to the performance of the shadowing operation. If the floating gate/trapping layer 60 is not negatively charged, such as when the floating gate/trapping layer 60 is positively charged as shown in FIG. 9B or is neutral, the hot band-to-band hole injection process will not occur, is illustrated in FIG. 9B, resulting in memory cell 50 having a "0" state, just as it did prior to performance of the shadowing process. Accordingly, if floating gate/trapping layer 60 has a positive charge after shadowing is performed, the volatile memory of floating body 24 will be restored to have a negative charge ("0" state), but if the floating gate/trapping layer 60 has a negative or neutral charge, the volatile memory of floating body 24 will be restored to have a positive charge ("1" state).

In one particular non-limiting example of this embodiment, about 0 volts is applied to terminal 72, about +2 volts is applied to terminal 74, about −1.2 volts is applied to terminal 70, and about +0.6 volts is applied to terminal 76. However, these voltage levels may vary, while maintaining the relative relationships between the charges applied, as described above. For example, voltage applied to terminal 72 may be in the range of about +1.5 volts to about +3.0 volts, voltage applied to terminal 74 may be in the range of about 0.0 volts to about +0.6 volts, voltage applied to terminal 70 may be in the range of about 0.0 volts to about −3.0 volts, and voltage applied to terminal 76 may be in the range of about 0.0 volts to about +1.0 volts.

Note that this process occurs non-algorithmically, as the state of the floating gate/trapping layer 60 does not have to be read, interpreted, or otherwise measured to determine what state to restore the floating body 24 to. Rather, the restoration process occurs automatically, driven by electrical potential differences. Accordingly, this process is orders of magnitude faster than one that requires algorithmic intervention. From these operations, it has been shown that cell 50 provides a memory cell having the advantages of a DRAM cell, but where non-volatility is also achieved.

Figure 10:
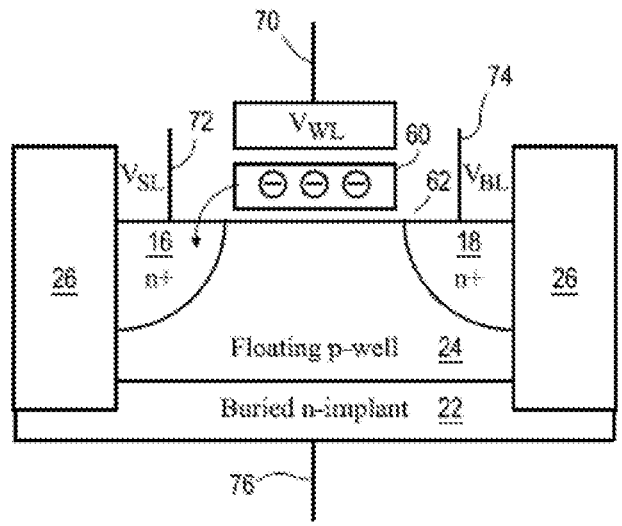
FIG. 10 illustrates resetting the floating gate(s)/trapping layer(s) to a predetermined state.

After restoring the memory cell(s) 50, the floating gate(s)/trapping layer(s) 60 is/are reset to a predetermined state, e.g., a positive state as illustrated in FIG. 10, so that each floating gate/trapping layer 60 has a known state prior to performing another shadowing operation. The reset process operates by the mechanism of electron tunneling from the floating gate/trapping layer 60 to the source region 18, as illustrated in FIG. 10.

To perform a reset operation according to the embodiment of FIG. 10, a highly negative voltage is applied to terminal 70, a substantially neutral voltage is applied to SL terminal 72, BL terminal 74 is allowed to float or is grounded, and a positive voltage is applied to terminal 76. By applying a neutral voltage to terminal 72 and maintaining the voltage of region 16 to be substantially neutral, this causes region 16 to function as a sink for the electrons from floating gate/trapping layer 60 to travel to by electron tunneling. A large negative voltages is applied to WL terminal 70 and a low positive voltage is applied to BW terminal 76. If the floating gate/trapping layer 60 is negatively charged, electrons will tunnel from floating gate/trapping layer 60 to region 16, and floating gate/trapping layer 60 will therefore become positively charged. As a result of the reset operation, all of the floating gate/trapping layer will become positively charged. In one particular non-limiting embodiment, about −18.0 volts is applied to terminal 70, and about +0.6 volts is applied to terminal 76. However, these voltage levels may vary, while maintaining the relative relationships between the charges applied, as described above. For example, voltage applied to terminal 70 may be in the range of about −12.0 volts to about −20.0 volts, and the voltage applied to terminal 76 max be in the range of about 0.0 volts to about 1.0 volts.

Having described the various operations of cell 50 above, reference is again made to FIG. 1 to describe operation of a memory device having a plurality of memory cells 50. The number of memory cells can vary widely, for example ranging from less than 100 Mb to several Gb, or more. It is noted that, except for the DRAM operations of writing and reading (event 104), which by necessity must be capable of individual, controlled operations, the remaining operations shown in FIG. 1 can all be carried out as parallel, non-algorithmic operations, which results in a very fast operating memory device.

At event 102, the memory device is initialized by first setting all of the floating gates/trapping layers to a positive state, in a manner as described above with reference to FIG. 10, for example. For example, a control line can be used to input a highly negative voltage to each of terminals 70, in parallel, with voltage settings at the other terminals as described above with reference to FIG. 10. Individual bits (or multiple bits, as described below) of data can be read from or written to floating bodies 24 of the respective cells at event 104.

The shadowing operation at event 106 is conducted in a mass parallel, non-algorithmic process, in any of the same manners described above, with each of the cells 50 performing the shadowing operation simultaneously, in a parallel operation. Because no algorithmic interpretation or measurement is required to transfer the data from non-volatile to volatile memory (24 to 60), the shadowing operation is very fast and efficient.

To restore the data into the volatile portion of the memory cells 50 of the memory device (i.e., restore charges in floating bodies 24), a state "0" is first written into each of the floating bodies 24, by a parallel process, and then each of the floating bodies is restored in any of the same manners described above with regard to a restoration process of a single floating body 24. This process is also a mass, parallel non-algorithmic process, so that no algorithmic processing or measurement of the states of the floating gates/trapping layers 60 is required prior to transferring the data stored by the floating gates/trapping layers 60 to the floating bodies 24. Thus, the floating bodies are restored simultaneously, in parallel, in a very fast and efficient process.

Upon restoring the volatile memory at event 108, the floating gates/trapping layers 60 are then reset at event 102, to establish a positive charge in each of the floating gates/trapping layers, in the same manner as described above with regard to initializing at event 102.

Figure 11A:
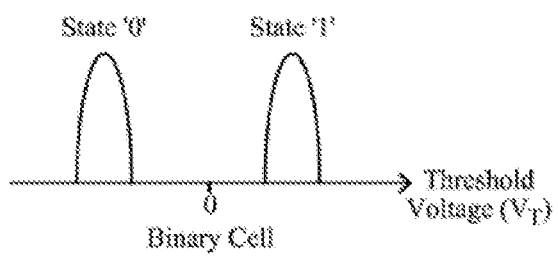
FIG. 11A illustrates the states of a binary cell, relative to threshold voltage.
Figure 11B:
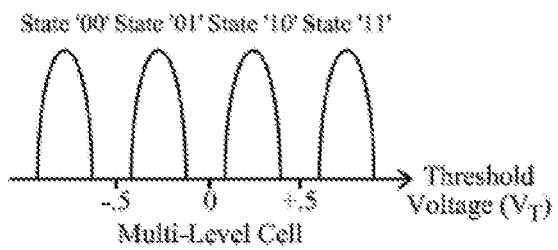
FIG. 11B illustrates the states of a multi-level cell, relative to threshold voltage.

Up until this point, the description of cells 50 have been in regard to binary cells, in which the data memories, both volatile and non-volatile, are binary, meaning that they either store state "1" or state "0". FIG. 11A illustrates the states of a binary cell, relative to threshold voltage, wherein a voltage less than or equal to a predetermined voltage (in one example, the predetermined voltage is 0 volts, but the predetermined voltage may be a higher or lower voltage) in floating body 24 is interpreted as state "0", and a voltage greater than the predetermined voltage in floating body 24 is interpreted as state "1". However, in an alternative embodiment, the memory cells described herein can be configured to function as multi-level cells, so that more than one bit of data can be stored in each cell 50. FIG. 11B illustrates an example of voltage states of a multi-level cell wherein two bits of data can be stored in each cell 50. In this case, a voltage less than or equal to a first predetermined voltage (e.g., 0 volts or some other predetermined voltage) and greater than a second predetermined voltage that is less than the first predetermined voltage (e.g., about −0.5 volts or some other voltage less than the first predetermined voltage) in floating body 24 volts is interpreted as state "01", a voltage less than or equal to the second predetermined voltage is interpreted as state "00", a voltage greater than the first predetermined voltage and less than or equal to a third predetermined voltage that is greater than the first predetermined voltage (e.g., about +0.5 volts or some other predetermined voltage that is greater than the first predetermined voltage) is interpreted to be state "10" and a voltage greater than the third predetermined voltage is interpreted as state "11".

The memory cell 50 described above with regard to FIGS. 2-10 can be described as a substantially planar memory cell. As the memory cell 50 is scaled to sub-50 nm features, it may be beneficial to provide a structure that overcomes short channel effects. As the channel length decreases, less gate charge is required to turn on the transistor. This results in a decrease of the threshold voltage and an increase of the off state leakage current. A device 50 such as illustrated in FIG. 12 suppresses the short channel effect by providing a gate that wraps around the silicon body, resulting in a stronger gate control of the transistor performance.

In addition, it may be advantageous to provide a structure that facilitates an increase of memory density over what is possible with a substantially planar design.

Figure 12:
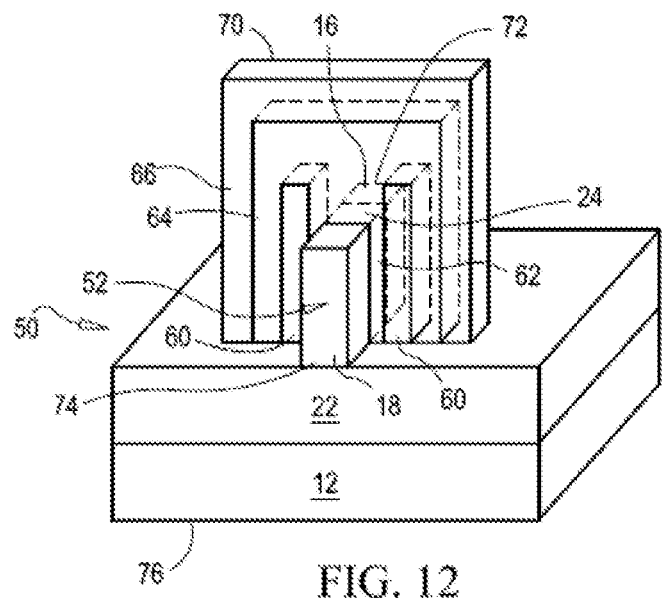
FIG. 12 illustrates a fin-type semiconductor memory cell device according to an embodiment of the present invention.
Figure 13:
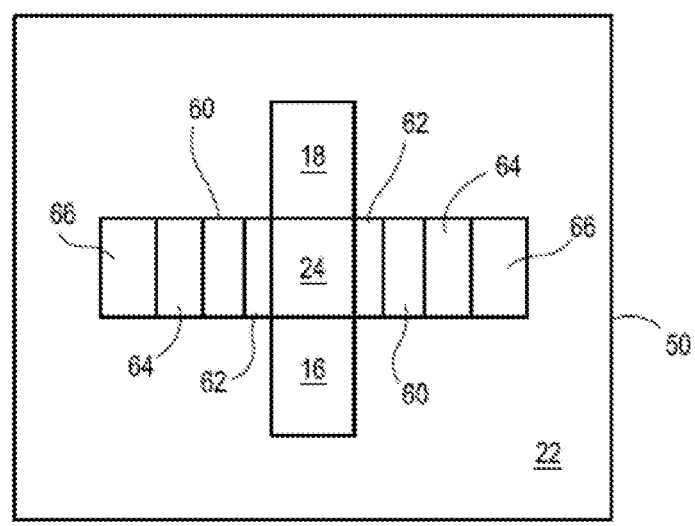
FIG. 13 is a schematic illustration of a top view of the cell of FIG. 12.

FIGS. 12 and 13 illustrate perspective and top views of an alternative embodiment of a memory cell 50 according to the present invention. In this embodiment, cell 50 has a fin structure 52 fabricated on a silicon-on-insulator (SOI) substrate 12, so as to extend from the surface of the substrate to form a three-dimensional structure, with fin 52 extending substantially perpendicularly to, and above the top surface of the substrate 12. Cell 50 is a capacitorless, one-transistor device. Fin structure 52 is conductive and is built on buried insulator layer 22, which may be buried oxide (BOX). Insulator layer 22 insulates the floating substrate region 24, which has a first conductivity type, from the bulk substrate 12. Fin structure 52 includes first and second regions 16, 18 having a second conductivity type. Thus, the floating body region 24 is bounded by the top surface of the fin 52, the first and second regions 16, 18 and the buried insulator layer 22. Fin 52 is typically made of silicon, but may comprise germanium, silicon germanium, gallium arsenide, carbon nanotubes, or other semiconductor materials known in the art.

Device 50 further includes floating gates or trapping layers 60 on two opposite sides of the floating substrate region 24, as shown in FIGS. 12 and 13. Floating gates/trapping layers 60 are insulated from floating body 24 by insulating layers 62. Floating gates/trapping layers 60 are positioned between the first and second regions 16, 18, adjacent to the floating body 24. A control gate 66 is capacitively coupled to floating gates/trapping layers 60 and is insulated therefrom via dielectric layer 64. The first and second regions 16,18 are spaced apart from one another on opposite ends of floating body 24 and define the channel region and the floating substrate region (floating body) 24.

Device 50 includes four terminals: word line (WL) terminal 70, source line (SL) terminal 72, bit line (BL) terminal 74 and substrate (SUB) terminal 76. Control gate 66 is connected to terminal 70, first and second regions 16, 18 are connected to terminals 72 and 74, respectively, or vice versa, and the bulk substrate 12 is connected to terminal 76.

When power is applied, cell 50 operates in volatile mode, like a capacitorless DRAM cell. That is, data (memory information) is stored in the floating body 24 of the transistor. The presence of electrical charge in the floating body 24 modulates the threshold voltage of the device 50.

Figure 14A:
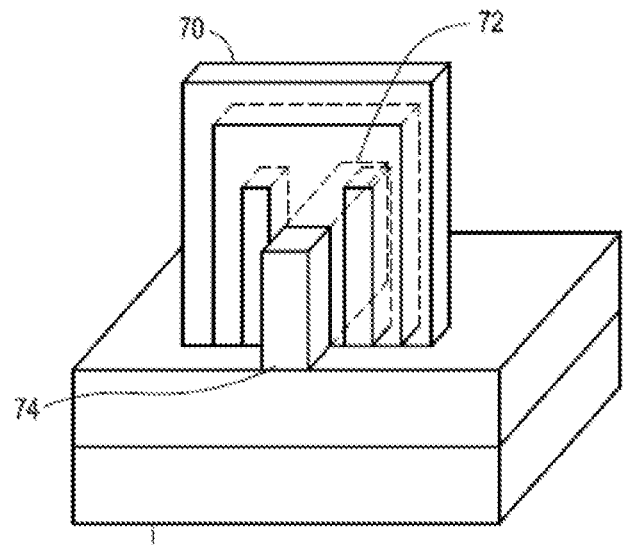
FIGS. 14A and 14B are referenced to illustrate write "1" operations on the device of FIG. 12.
Figure 14B:
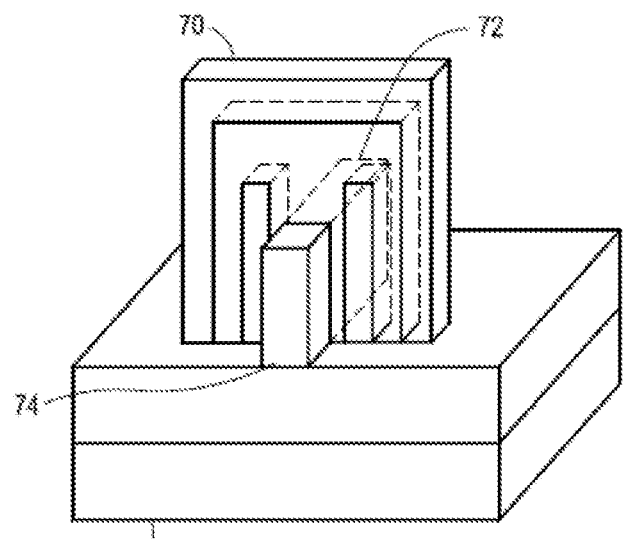

FIGS. 14A-14B illustrate alternative write state "1" operations that can be carried out on an embodiment of cell 50 as described in FIG. 12-13, by performing band-in-band tunneling hot hole injection (FIG. 14A) or impact ionization hot hole injection (FIG. 14B). In alternative embodiments, electrons can be transferred, rather than holes. In FIG. 14A, to write a state "1" into the floating body region 24, a neutral voltage is applied to SL terminal 72, a positive voltage is applied to BL terminal 74, a negative voltage is applied to WL terminal 70 and a large negative voltage which is more negative than the negative voltage applied to terminal 70, is applied to SUB terminal 76. Under these conditions, holes are injected from BL terminal 74 into the floating body region 24, leaving the body region 24 positively charged.

In one particular non-limiting embodiment, a charge of about 0.0 volts is applied to terminal 72, a charge of about +2.0 volts is applied to terminal 74, a charge of about −1.2 volts is applied to terminal 70, and a charge of about −10.0 volts is applied to terminal 76. However, these voltage levels may vary, while maintaining the relative relationships between the charges applied, as described above. For example, voltage applied to terminal 72 may be in the range of about 0.0 volts to about +0.4 volts, voltage applied to terminal 74 may be in the range of about +15 volts to about +3.0 volts, voltage applied to terminal 70 may be in the range of about 0.0 volts to about −3.0 volts, and voltage applied to terminal 76 may be in the range of about −4.0 volts to about −12.0 volts. Further, the voltages applied to terminals 72 and 74 may be reversed, and still obtain the same result.

Alternatively, as illustrated in FIG. 14B, to write a state "1" into the floating body region 24, a substantially neutral voltage is applied to SL terminal 72, a positive voltage is applied to BL terminal 74, a positive voltage less positive than the positive voltage applied to terminals 72 and 74 is applied to WL terminal 70 and a negative is applied to SUB terminal 76. Under these conditions, holes are injected front BL terminal 74 into the floating body region 24, leaving the body region 24 positively charged.

In one particular non-limiting embodiment, about 0.0 volts is applied to terminal 72, about +2.0 volts is applied to terminal 74, about +1.2 volts is applied to terminal 70, and about −10.0 volts is applied to terminal 76. However, these voltage levels may vary, while maintaining the relative relationships between the charges applied, as described above. For example, voltage applied to terminal 72 may be in the range of about 0.0 volts to about +0.6 volts, voltage applied in terminal 74 may be in the range of about +1.5 volts to about +3.0 volts, voltage applied to terminal 70 may be in the range of about 0.0volts to about +1.6 volts, and voltage applied to terminal 76 may be in the range of about −4.0 volts to about −12.0 volts. Further, the voltages applied to terminals 72 and 74 may be reversed, and still obtain the same result, e.g., a positive voltage applied to terminal 72 and a neutral charge applied to terminal 74.

Figure 15:
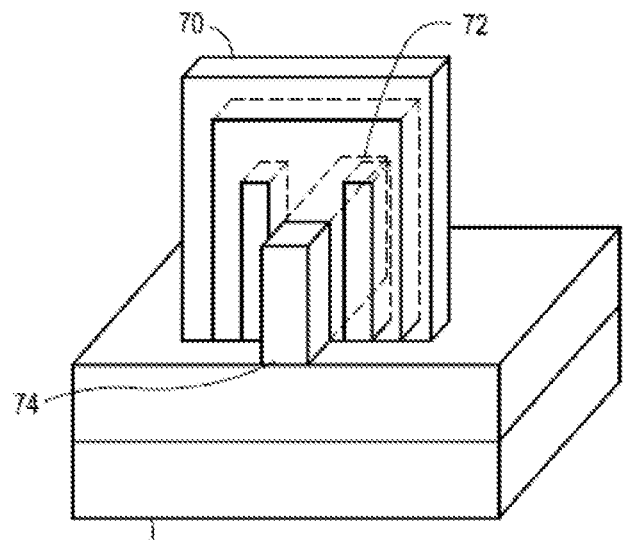
FIG. 15 is referenced to illustrate a write "0" operation on the device of FIG. 12.

FIG. 15 illustrates a write state "0" operation that can be carried out on cell 50. To write a state "0" into floating body region 24, a negative voltage is applied to SL terminal 72, a substantially neutral voltage is applied to BL terminal 74, a negative voltage that is less negative than the negative voltage applied to terminal 72 is applied to WL terminal 70 and a substantially neutral voltage is applied to SUB terminal 76. Under these conditions, all p-n junctions (junction between 24 and 16 and between 24 and 18) are forward-biased, evacuating any holes from the floating body 24.

In one particular non-limiting embodiment, about −2.0 volts is applied to terminal 72, about 0.0 volts is applied to terminal 74, about −1.2 volts is applied to terminal 70, and about 0.0 volts is applied to terminal 76. However, these voltage levels may vary, while maintaining the relative relationships between the charges applied, as described above. For example, voltage applied to terminal 72 may be in the range of about −1.0 volts to about −3.0 volts, voltage applied to terminal 74 may be in the range of about 0.0 volts to about −3.0 volts, voltage applied to terminal 70 may be in the range of about 0.0 volts to about −3.0 volts. and voltage applied to terminal 76 may be in the range of about 0.0 volts to about +2.0 volts. Further, the voltages applied to terminals 72 and 74 may be reversed, and still obtain the same result, e.g., a substantially neutral voltage applied to terminal 72 and a negative charge applied to terminal 74.

Figure 16:
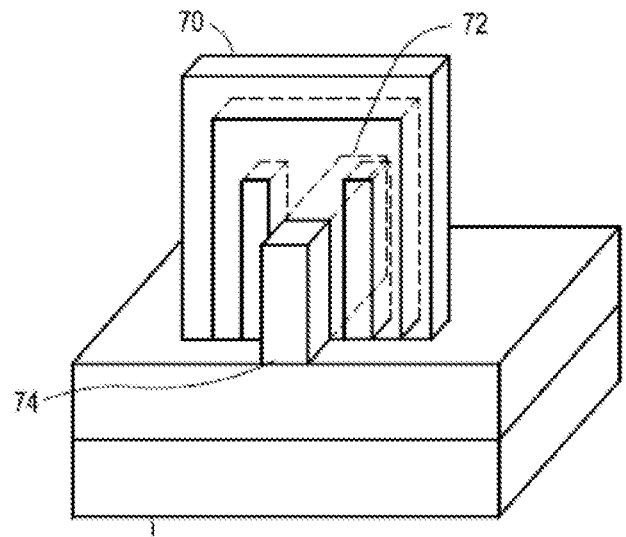
FIG. 16 is referenced to illustrate a read operation on the device of FIG. 12.

A read operation of the cell 50 is now described with reference to FIG. 16. To read cell 50, a substantially neutral charge is applied to SL terminal 72, a positive voltage is applied to BL terminal 74, a positive voltage that is more positive than the positive voltage applied to terminal 74 is applied to WL terminal 70 and a negative voltage is applied to SUB terminal 76. If cell 50 is in a state "1" having holes in the body region 24, then a lower threshold voltage (gate voltage where the transistor is turned on) is observed compared to the threshold voltage observed when cell 50 is in a state "0" having no holes in body region 24.

In one particular non-limiting embodiment, about 0.0 volts is applied to terminal 72, about +0.4 volts is applied to terminal 74, about +1.2 volts is applied to terminal 70, and about −10.0 volts is applied to terminal 76. However, these voltage levels may vary, while maintaining the relative relationships between the charges applied, as described above. For example, terminal 72 is grounded and is thus at about 0.0 volts, voltage applied to terminal 74 may be in the range of about +0.1 volts to about +1.0 volts, voltage applied to terminal 70 may be in the range of about +1.0 volts to about +3.0 volts, and voltage applied to terminal 76 may be in the range of about −4.0 volts to about −12.0 volts. Further, the voltages applied to terminals 72 and 74 may be reversed, and still obtain the same result, e.g., a positive voltage applied to terminal 72 and a neutral charge applied to terminal 74.

Figure 17A:
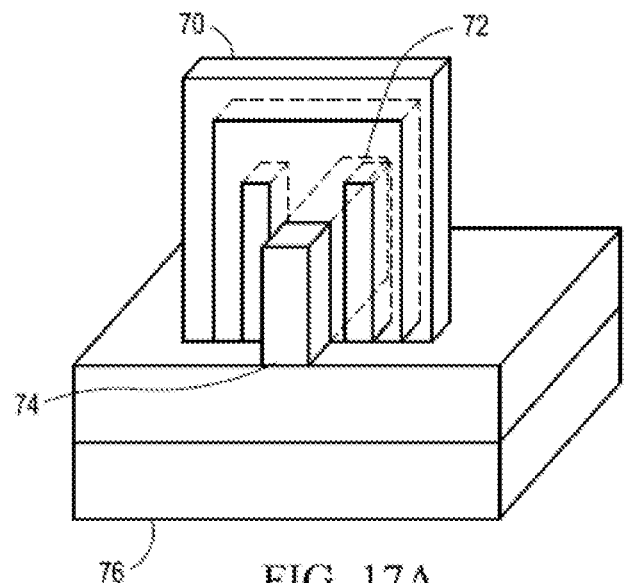
FIGS. 17A and 17B illustrate a shadowing operation on the device of FIG. 12.
Figure 17B:
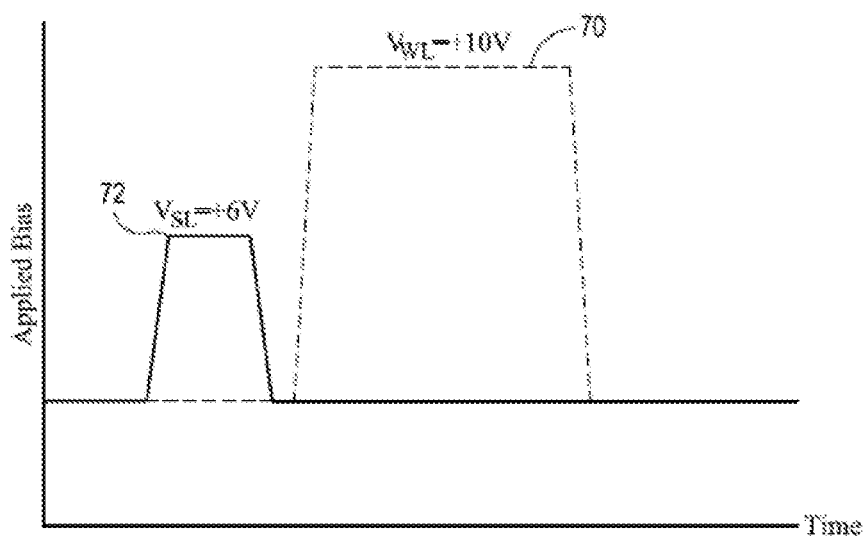

When power down is detected, e.g., when a user turns off the power to cell 50, or the power is inadvertently interrupted, or for any other reason, power is at least temporarily discontinued to cell 50, data stored in the floating body region 24 is transferred to floating gate/trapping layer 60 via a shadowing operation. With reference to FIGS. 17A and 17B, the shadowing operation may be performed by first applying a high positive voltage to terminal 72. After a short period of time (e.g., a time period in the range of about 500 ns to about 10 µs, typically about 1 µs), the voltage applied to terminal 72 is brought down to substantially neutral (i.e., ground), followed by application of a high positive voltage to terminal 70. A negative voltage is applied to terminal 76 throughout the operation, and a substantially neutral voltage is applied to terminal 74. If the memory transistor does not have holes in the floating substrate 24 (state "0") the voltage conditions applied to cell 50 as described will result in a potential difference between the n$^+$ junctions and the p-type floating substrate 24, sufficient to generate substrate transient hot electrons. If cell 50 is in a state "1" (i.e., memory transistor has holes in the floating substrate 24), a lower electric field between the n$^+$ junctions and the p-type floating substrate 24 exists, and, as a result, no transient hot electrons are generated. In the former case (state "0") the transient hot electrons that are generated are collected in the floating gate/trapping layer 60 due to the electric field resulting from the high positive bias applied on the control gate 66 via terminal 70. Alternatively, a high negative voltage can be applied to terminal 70 to collect transient hot holes.

In one particular non-limiting embodiment, a voltage of about +6.0 volts is initially applied to terminal 72. After bringing the voltage applied to terminal 72 down to ground, a voltage of about +10.0 volts is applied to terminal 70. Voltages of about 0 volts and about −10.0 volts, respectively, are applied to terminals 74 and 76 throughout the process. However, these voltage levels may vary, while maintaining the relative relationships between the charges applied, as described above. For example, voltage applied to terminal 72 may be in the range of about +3.0 volts to about +6.0 volts, prior to dropping the voltage to about 0 volts; voltage applied to terminal 70 may be in the range of about +3.0 volts to about +12.0 volts; voltage applied to terminal 74 may be in the range of about 0.0 volts to about +0.6 volts, and voltage applied to terminal 76 may be in the range of about −4.0 volts to about −12.0 volts. Further, the voltages applied to terminals 72 and 74 may be reversed, and still obtain the same result.

When power is restored to cell 50, the state of the cell 50 memory transistor as stored on floating gate/trapping layer 60 is restored into floating body region 24. The restore operation (data restoration from non-volatile memory to volatile memory) is described with reference to FIG. 18. Prior to the restore operation/process, the floating body 24 is set to a neutral or negative charge, i.e., a "0" state is written to floating body 24. In one embodiment, to perform the restore operation, a substantially neutral voltage is applied to terminal 72, a positive voltage is applied to terminal 74, a positive voltage that is less positive than the positive voltage applied to terminal 74 is applied to terminal 70, and a negative voltage is applied to terminal 76. If the floating gate/trapping layer 60 is not negatively charged, holes are injected from the BL terminal 74 into the floating body 24, leaving the floating body 24 positively charged and therefore in a state "1". Conversely, if floating gate/trapping layer 60 is negatively charged, no hole injection occurs into the floating substrate 24 and therefore floating substrate 24 results in state "0".

Figure 18:
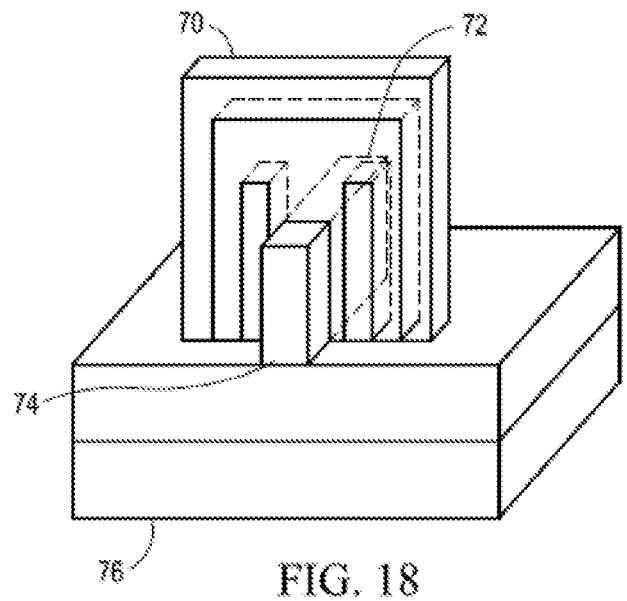
FIG. 18 is referenced to illustrate a restore operation on the device of FIG. 12.

Still referring to FIG. 18, in one non-limiting exemplary embodiment of the restore process, a voltage of about 0 volts is applied to terminal 72, a voltage of about −2.0 volts is applied to terminal 74, a voltage of about +1.2 volts is applied to terminal 70, and a voltage of about −10 volts is applied to terminal 76. However, these voltage levels may vary, while maintaining the relative relationships between the charges applied, as described above. For example, voltage applied to terminal 70 mas be in the range of about 0.0 volts to about +1.6 volts, voltage applied to terminal 72 may be in the range of about 0.0 volts to about +0.6 volts, voltage applied to terminal 74 may be in the range of about +1.5 volts to about +3.0 volts, and voltage applied to terminal 76 may be in the range of about −4.0 volts to about −12.0 volts. Further, the voltages applied to terminals 72 and 74 may be reversed, and still obtain the same result.

In another embodiment of operation of the cell 50 of FIG. 12 to perform a volatile to non-volatile shadowing process, the process operates by a hot electron injection process. To perform a shadowing process according to this embodiment, a high positive voltage is applied to terminal 72 and a substantially neutral voltage is applied to terminal 74. Alternatively, a high positive voltage can be applied to terminal 74 and a substantially neutral voltage can be applied to terminal 72. A positive voltage is applied to terminal 70 and a negative voltage is applied to terminal 76. A high voltage in this case is a voltage greater than or equal to about +3 volts. In one example, a voltage in the range of about +3 to about +6 volts is applied, although it is possible to apply a higher voltage.

The floating gate/trapping layer 60 will have been previously initialized or reset to have a positive charge prior to the operation of the cell 50 to store data in non-volatile memory via floating body 24. When floating body 24 has a positive charge/voltage, the NPN junction is on, as noted above. The application of the high voltage to terminal 72 at 16 energizes/accelerates electrons traveling through the floating body 24 to a sufficient extent that they can "jump over" the oxide barrier 62 between floating body 24 and floating gate/trapping layer 60, so that electrons enter floating gate/trapping layer 60. Accordingly, floating gate/trapping layer 60 becomes negatively charged by the shadowing process, when the volatile memory of cell 50 is in state "1" (i.e., floating body 24 is positively charged).

When volatile memory of cell 50 is in state "0" i.e., floating body 24 has a negative or neutral charge/voltage, the NPN junction is off as noted above, and electrons do not flow in the floating body 24. Accordingly, when voltages are applied to the terminals as described above, in order to perform the shadowing process, the high positive voltage applied to terminal 72 does not cause an acceleration of electrons in order to cause hot electron injection into floating gate/trapping layer 60, since the electrons are not flowing. Accordingly, floating gate/trapping layer 60 retains its positive charge at the end of the shadowing process, when the volatile memory of cell 50 is in state "0" (i.e., floating body 24 is neutral or negatively charged). Note that the charge state of the floating gate/trapping layer 60 is complementary to the charge state of the floating body 24 after completion of the shadowing process. Thus, if the floating body 24 of the memory cell 50 has a positive charge in volatile memory, the floating gate/trapping layer 60 will become negatively charged by the shadowing process, whereas if the floating body of the memory cell 50 has a negative or neutral charge in volatile memory, the floating gate/trapping layer 60 will be positively charged at the end of the shadowing operation. The charges/states of the floating gates/trapping layers 60 are determined non-algorithmically by the states of the floating bodies, and shadowing of multiple cells occurs in parallel, therefore the shadowing process is very fast.

In one particular non-limiting example of the shadowing process according to this embodiment, about +3 volts are applied to terminal 72, about 0 volts are applied to terminal 74, about +1.2 volts are applied to terminal 70, and about −10.0 volts are applied to terminal 76. However, these voltage levels may vary, while maintaining the relative relationships between the charges applied, as described above. For example, voltage applied to terminal 72 may be in the range of about +3 volts to about +6 volts, the voltage applied to terminal 74 may be in the range of about 0.0 volts to about +0.4 volts, the voltage applied to terminal 70 may be in the range of about 0.0 volts to about +1.6 volts, and voltage applied to terminal 76 may be in the range of about −4.0 volts to about −12.0 volts.

In another embodiment to perform a restore process, terminal 72 is set to a substantially neutral voltage, a positive voltage is applied to terminal 74, a negative voltage is applied to terminal 70 and a negative voltage that is more negative than the negative voltage applied to terminal 70 is applied to terminal 76. If the floating gate/trapping layer 60 is negatively charged, this negative charge enhances the driving force for the band-to-band hot hole injection process, whereby holes are injected from the n-region 18 into floating body 24. thereby restoring the "0" state that the volatile memory cell 50 had held prior to the performance of the shadowing operation. If the floating gate/trapping layer 60 is not negatively charged, such as when the floating gate/trapping layer 60 is positively charged or is neutral, the hot band-to-band hole injection process will not occur, resulting in memory cell 50 having a "0" state, just as it did prior to performance of the shadowing process. Accordingly, if floating gate-trapping layer 60 has a positive charge after shadowing is performed, the volatile memory of floating body 24 will be restored to have a negative charge ("0" state), but if the floating gate/trapping layer 60 has a negative or neutral charge, the volatile memory of floating body 24 will be restored to have a positive charge ("1" state).

In one particular non-limiting example of this embodiment, about 0 volts is applied to terminal 72, about +2 volts is applied to terminal 74, about −1.2 volts is applied to terminal 70, and about +0.6 volts is applied to terminal 76. However, these voltage levels may vary, while maintaining the relative relationships between the charges applied, as described above. For example, voltage applied to terminal 72 may be in the range of about +1.5 volts to about +3.0 volts, voltage applied to terminal 74 may be in the range of about 0.0 volts to about +0.6 volts, voltage applied to terminal 70 may be in the range of about 0.0 volts to about −3.0 volts, and voltage applied to terminal 76 may be in the range of about −4.0 volts to about −12.0 volts.

Note that the restore processes described above are non-algorithmic processes, as the state of the floating gate/trapping layer 60 does not have to be read, interpreted, or otherwise measured to determine what state to restore the floating body 24 to. Rather, the restoration process occurs automatically, driven by electrical potential differences. Accordingly, this process is orders of magnitude faster than one that requires algorithmic intervention. Similarly, it is noted that the shadowing processes described above are also performed as non-algorithmic processes. When multiple cells 50 are provided in a memory device, shadowing and restore operations are performed as parallel, non-algorithmic processes. From these operations, it has been shown that cell 50 provides a memory cell having the advantages of a DRAM cell, but where non-volatility is also achieved, and wherein a fin is provided to facilitate denser packing of memory cells and to suppress short channel effects, which in turn allows device scaling to smaller geometry.

Figure 19:
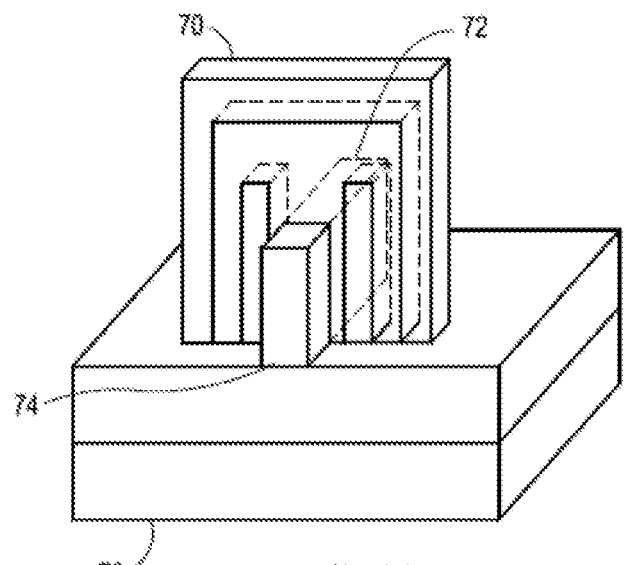
FIG. 19 is referenced to illustrate a reset operation on the device of FIG. 12.

After restoring the memory cell(s) 50, the floating gate(s)/trapping layer(s) 60 is/are reset to a predetermined initial state, e.g., a positive state as illustrated in FIG. 19, so that each floating gate/trapping layer 60 has a known state prior to performing another shadowing operation. The reset process operates by the mechanism of electron tunneling from the floating gate/trapping layer 60 to the source region 18, as illustrated in FIG. 19.

To perform a reset operation according to the embodiment of FIG. 19, a highly negative voltage is applied to terminal 70, a substantially neutral voltage is applied to SL terminal 72, BL terminal 74 is allowed to float or is grounded (e.g., a substantially neutral charge can be applied), and a negative voltage that is less negative than the negative voltage applied to terminal 70 is applied to terminal 76. By applying a neutral voltage to terminal 72 and maintaining the voltage of region 16 to be substantially neutral, this causes region 16 to function as a sink for the electrons from floating gate/trapping layer 60 to travel to by electron tunneling. A large negative voltage is applied to WL terminal 70 and a less negative voltage is applied to SUB terminal 76. If the floating gate/trapping layer 60 is negatively charged, electrons will tunnel from floating gate-trapping layer 60 to region 16, and floating gate/trapping layer 60 will therefore become positively charged. As a result of the reset operation, all of the floating gate/trapping layer will become positively charged. In one particular non-limiting embodiment, about −18.0 volts is applied to terminal 70, and about −10.0 volts is applied to terminal 76. However, these voltage levels may vary, while maintaining the relative relationships between the charges applied, as described above. For example, voltage applied to terminal 70 may be in the range of about −12.0 volts to about −20.0 volts, voltage applied to terminal 72 may be in the range of about 0.0 volts to about +3.0 volts, voltage applied to terminal 74 may be in the range of about 0.0 volts to about +3.0 volts, and the voltage applied to terminal 76 may be in the range of about −4.0 volts to about −12.0 volts. Further, the voltages applied to terminals 72 and 74 may be reversed, and still obtain the same result.

Alternatively, if hot holes are collected during the shadowing operation, then a high positive voltage (e.g., about +18.0 volts, or a voltage in the range of about +12.0 volts to about +20.0 volts is applied to terminal 70 to reset the floating gate(s)/trapping layer(s) 60 to the initial state. Under this condition, electrons will tunnel into the floating gate(s)/trapping layer(s) 60 from the n+ junction region (either 16 or 18, or both, depending on whichever region(s) is/are grounded), resulting in the floating gate(s)/trapping layer(s) 60 being negatively charged in the initial state.

Figure 20:
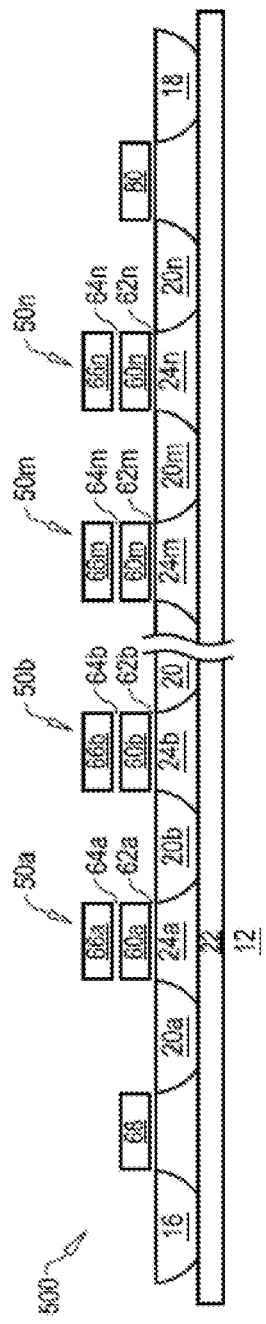
FIG. 20 is a cross-sectional schematic illustration of a memory string according to an embodiment of the present invention.

Referring now to FIG. 20, a cross-sectional schematic illustration of a memory string 500 that includes a plurality of memory cells 50 is shown Memory string 500 includes a plurality of memory cells 50 connected in a NAND architecture, in which the plurality of memory cells 50 are serially connected to make one string of memory cells. String 500 includes "n" memory cells 50, where "n" is a positive integer, which typically ranges between 8 and 64, and in at least one example, is 16.

String 500 includes a selection transistor 68, a ground selection transistor 80, and a plurality (i.e., "n") memory cell transistors 50 (50a, 50b, . . . , 50m, 50n), all of which are connected in series. Each memory cell transistor 50 includes a floating body region 24 of a first conducting type, and first and second regions 20 (corresponding to first and second regions 16 and 18 in the single cell embodiments of cell 50 described above) of a second conductivity type, which are spaced apart from each other and define a channel region. A buried insulator layer 22 isolates the floating body region 24 from the bulk substrate 12. A floating gate or trapping layer 60 is positioned above the surface of floating body 24 and is in between the first and second regions 20. An insulating layer 62 is provided between floating gate/trapping layer 60 and floating body 24 to insulate floating gate/trapping layer 60 from floating body 24. A control gate 66 is insulated and separated from the floating gate/trapping layer 60 by an insulating layer 64. The control gate 66 is capacitively coupled to the floating gate/trapping layer 60. The relationship between the floating gate/trapping layer 60 and the control gate 66 is similar to that of a non-volatile stacked gate floating gate memory cell. Cells 50 may be provided as substantially planar cells, such as the embodiments described above with reference to FIGS. 1-10, or may be provided as fin-type, three-dimensional cells, such as the embodiments described above with reference to FIGS. 12-19. Other variations, modifications and alternative cells 50 may be provided without departing from the scope of the present invention and its functionality.

Figure 21:
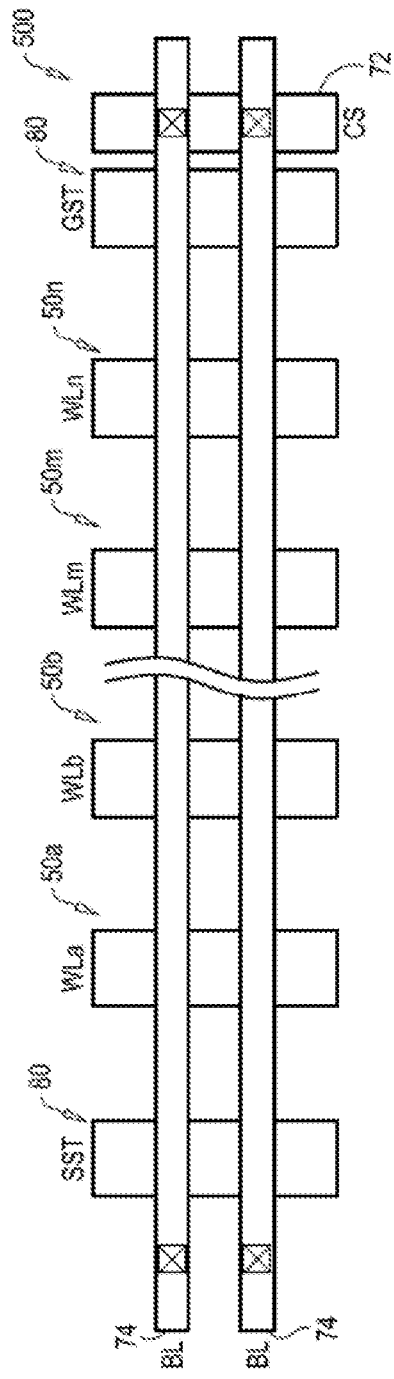
FIG. 21 illustrates a top schematic view of the string of FIG. 20.

FIG. 21 illustrates a top view of the string 500. As noted, the memory cell transistors 50 are serially connected. A memory array is typically arranged in a grid, with the WL terminal being used to select the row and the BL terminal being sued to select the column, so that, in combination, any single memory cell (or more) in the grid can be selected. String 500 lies in the column direction of the grid. Thus, the serial connection arrangement typically defines a memory array column direction. Adjacent columns are separated by columns of isolation, such as shallow trench isolation (STI). The drain region of the string selection transistor 68 is connected to the bit line (BL) 74. FIG. 21 illustrates two columns, and thus, two bit lines 74, for exemplary purposes. In practice, there will typically be many more than two columns. The source region of the ground selection transistor 80 is connected to the SL terminal 72. The control gates 66 extend in row directions. As can also be seen in FIG. 21, the WL and BL pitches can each be made to be 2F, where F is defined as the feature size (the smallest lithography feature). Accordingly, each memory cell transistor 50 has a size of $4F^2$.

FIGS. 22A-22B illustrate alternative write state "1" operations that can be carried out string 500, by performing band-to-band tunneling hot hole injection (FIG. 22A) or impact ionization hot hole injection (FIG. 22B). In alternative embodiments, electrons can be transferred, rather than holes. In FIG. 22A, to write a state "1" into a floating body region 24 of a selected cell 50, a substantially neutral voltage is to terminal 72, a positive voltage is applied to BL terminal 74, a negative voltage is applied to the selected control gate 66 (i.e., 66b in the example of FIG. 22A) via terminal 70 of the selected memory cell 50, a positive voltage, more positive that the positive voltage applied to terminal 74 is applied to the passing control gates 66 (i.e., control gates 66 of the cells 50 not having been selected), positive voltage about equal to the positive voltage applied to the passing control gates 66 is applied to the gates of the string selection transistor 68 and the ground selection transistor 80, and a negative voltage more negative than the negative voltage applied to the selected control gate 66 is applied to the substrate via terminal 76. The voltages applied to the selection transistors 68 and 80 and the passing control gates 66 are such that the channel regions underneath the respective gates of these transistors are turned on. Under these conditions, holes are injected from the drain side of the selected memory transistor 50 into the floating substrate region 24 of the selected memory transistor 50 leaving the floating substrate positively charged, i.e. in the "1" state.

In one particular non-limiting embodiment, as illustrated in FIG. 22A, a voltage of about 0.0 volts is applied to terminal 72, about +2.0 volts is applied to terminal 74, about −1.2 volts is applied to terminal 70 of the selected control gate 66, about +3.0 is applied to the terminals 70 of the passing control gates 66, about +3.0 volts is applied to the gate of the string selection transistor 68, about +3.0 volts is applied to the gate of the ground selection transistor 80, and a voltage of about −10.0 volts is applied to the substrate via terminal 76. However, these voltage levels may vary, while maintaining the relative relationships between the charges applied, as described above. For example, voltage applied to terminal 72 may be in the range of about 0.0 volts to about +0.6 volts, voltage applied to terminal 74 may be in the range of about +1.5 volts to about +3.0 volts, voltage applied to terminal 70 of the selected control gate 66 may be in the range of about 0.0 volts to about −3.0 volts; voltage applied to the terminals 70 of the passing control gates 66 of the cells 50 not selected may be in the range of about +2.0 volts to about +6.0 volts, voltage applied to the gate of the string selection transistor 68 may be in the range of about +1.0 volts to about +5.0 volts, voltage applied to the gate of the ground selection transistor 80 may be in the range of about +1.0 volts to about +5.0 volts, and voltage applied to terminal 76 may be in the range of about −4.0 volts to about −12.0 volts. Further, the voltages applied to terminals 72 and 74 may be reversed, and still obtain the same result, even when the voltages applied to terminals 72 and 74 are not equal.

Alternatively, as illustrated in FIG. 22B, to write a state "1" into the floating body region 24 of a selected memory cell transistor 50, a substantially neutral voltage may be applied to terminal 72, a positive voltage may be applied to BL terminal 74, a positive voltage less positive than the positive voltage applied to terminal 74 may be applied to gate 66 of the selected cell 50 via terminal 70 of the selected cell 50, a positive voltage more positive than the positive voltage applied to terminal 74 is applied to terminals 70 of each of the non-selected cells 50, a positive voltage more positive than the positive voltage applied to terminal 74 is applied to the gate of string selection transistor 68, a positive voltage more positive than the positive voltage applied to terminal 74 is applied to the gate of ground selection transistor 80, and a negative voltage is applied to the substrate via terminal 76. Under these conditions, holes are injected from the drain side of the selected memory transistor cell 50 into the floating body region 24 of the selected memory cell 50, leaving the body region 24 positively charged and thus putting the selected memory cell 50 in state "1".

In one particular non-limiting embodiment as illustrated in FIG. 22B, about 0.0 volts is applied to terminal 72, about +2.0 volts is applied to terminal 74, about +1.2 volts is applied to control gate 66 via terminal 70 of the selected memory cell (in this example, cell 50b), about +3.0 volts is applied to each of the control gates 66 of the non-selected memory cells, a voltage of about +3.0 volts is applied to the gate of the string selection transistor 68, a voltage of about +3.0 volts is applied to the gate of the ground selection transistor 80, and a voltage of about −10.0 volts is applied to terminal 76.

However, these voltage levels may vary, while maintaining the relative relationships between the charges applied, as described above. For example, voltage applied to terminal 72 may be in the range of about 0.0 volts to about +0.6 volts, voltage applied to terminal 74 may be in the range of about +1.5 volts to about +3.0 volts, voltage applied to terminal 70 of the selected control gate 66 may be in the range of about 0.0 volts to about +1.6 volts; voltage applied to the terminals 70 of the passing control gates 66 of the cells 50 not selected may be in the range of about +1.0 volts to about +5.0 volts, voltage applied to the gate of the siring selection transistor 68 may be in the range of about +1.0 volts to about +5.0 volts, voltage applied to the gate of the ground selection transistor 80 may be in the range of about +1.0 volts to about +5.0 volts, and voltage applied to terminal 76 may be in the range of about −4.0 volts to about −12.0 volts. Further, the voltages applied to terminals 72 and 74 may be reversed, and still obtain the same result.

FIG. 23 illustrates an example of a write state "0" operation carried out on a selected cell 50 of the string 500. To write a state "0" into the floating body region 24 of a selected memory cell transistor, a negative voltage is applied to SL terminal 72, a substantially neutral voltage is applied to BL terminal 74, a substantially neutral voltage is applied to all of the control gates 66 via their respective WL terminals 70, a positive voltage is applied to the gate of the ground selection transistor 80, a substantially neutral voltage is applied to the gate of the string selection transistor 68, and a substantially neutral voltage is applied to the substrate via terminal 76. Under these conditions, all p-n junctions are forward-biased, evacuating any holes from die floating body 24. The write "0" operation is performed simultaneously on all cells sharing the same SL terminal 72.

In one particular non-limiting embodiment, as illustrated in FIG. 23, about −2.0 volts is applied to terminal 72, about 0.0 volts is applied to terminal 74, about 0.0 volts is applied to each of terminals 70, a voltage of about +3.0 volts is applied to the gate of the ground selection transistor 80, a voltage of about 0.0 volts is applied to the gate of the string selection transistor 68, and about 0.0 volts is applied to terminal 76.

However, these voltage levels may vary, while maintaining the relative relationships between the charges applied, as described above. For example, voltage applied to terminal 72 may be in the range of about −1.0 volts to about −3.0 volts, voltage applied to terminal 74 may be in the range of about 0.0 volts to about −3.0 volts, voltage applied to each of the terminals 70 may be in the range of about 0.0 volts to about −3.0 volts, voltage applied to the gate of the string selection transistor 68 may be in the range of about 0.0 volts to about 5.0 volts, voltage applied to the gate of the ground selection transistor 80 max be in the range of about 0.0 volts to about +5.0 volts, and voltage applied to terminal 76 may be in the range of about 0.0 volts to about +2.0 volts. Further, the voltages applied to terminals 72 and 74 may be reversed, and still obtain the same result, even when the voltages applied to terminals 72 and 74 are not equal.

A read operation is now described with reference to FIG. 24. To read the data of a selected cell 50, a substantially neutral charge is applied to SL terminal 72, a positive voltage is applied to BL terminal 74, a positive voltage that is more positive than the positive voltage applied to terminal 74 is applied to WL terminal 70 of the control gate 66 of the selected cell 50, a positive voltage that is more positive than the positive voltage applied to the terminal 70 of the selected cell is applied to each of passing control gates 66 via the terminals 70 of the non-selected cells 50, a positive voltage that is more positive than the positive voltage applied to the terminal 70 of the selected cell is applied to the gate of the string selection transistor 68, a positive voltage that is more positive than the positive voltage applied to the terminal 70 of the selected cell is applied to the gate of the ground selection terminal 80, and a negative voltage is applied to terminal 76. The voltages applied to the selection transistors 68, 80 and the passing control gates 66 are such that the channel regions underneath these gates are turned on. If the selected memory transistor cell 50 is in a state "1" having holes in the floating body region 24 thereof, then a relatively lower threshold voltage is observed, relative to when the selected memory transistor cell 50 is in a state "0" and has no holes in the floating body region 24.

In one particular non-limiting embodiment, about 0.0 volts is applied to terminal 72, about +0.4 volts is applied to terminal 74, about +1.2 volts is applied to terminal 70 (and thus control gate 66) of the selected memory cell 50, about +3.0 volts is applied to each of the terminals 70 (and thus the passing control gates 66) of the non-selected memory cells 50, a voltage of about +3.0 volts is applied to the gate of the string selection transistor 68, a voltage of about +3.0 volts is applied to the gate of the ground selection transistor 80, and about −10.0 volts is applied to terminal 76.

However, these voltage levels may vary, while maintaining the relative relationships between the charges applied, as described above. For example, terminal 72 is grounded, and thus at about 0.0 volts, voltage applied to terminal 74 may be in the range of about +3.1 volts to about +1.0 volts, voltage applied to terminal 70 of the selected control gate 66 may be in the range of about 0.0 volts to about +3.0 volts; voltage applied to the terminals 70 of the passing control gates 66 of the cells 50 not selected may be in the range of about +1.0 volts to about +3.0 volts, voltage applied to the gate of the string selection transistor 68 may be in the range of about +1.0 volts to about +5.0 volts, voltage applied to the gate of the ground selection transistor 80 may be in the range of about +1.0 volts to about +5.0 volts, and voltage applied to terminal 76 may be in the range of about −4.0 volts to about −12.0 volts. Further, the voltages applied to terminals 72 and 74 may be reversed, and still obtain the same result, even when the voltages applied to terminals 72 and 74 are not equal.

Figure 25A:
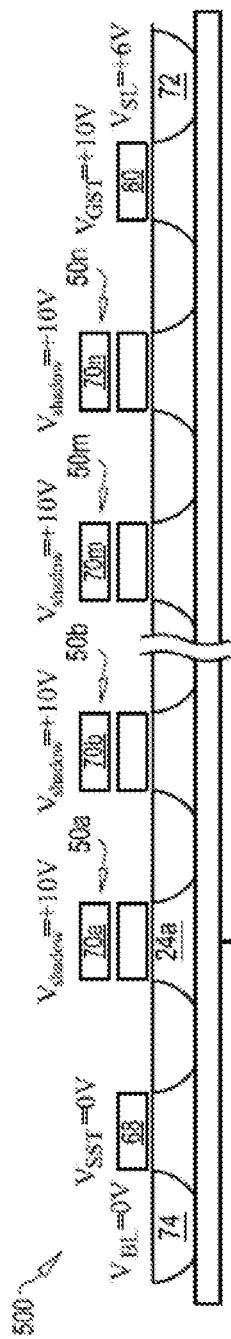
FIGS. 25A-25B illustrate a shadowing operation on the string of FIG. 20.
Figure 25B:
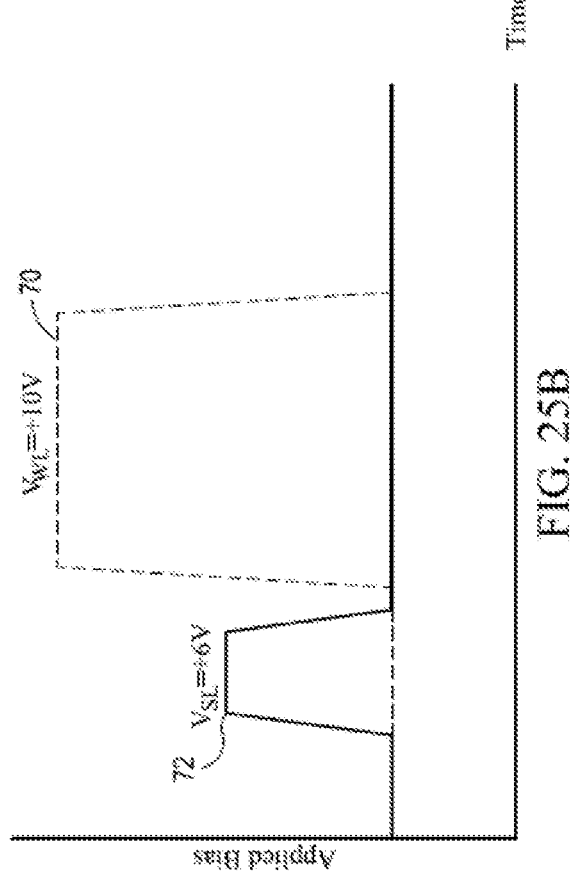

When power down is detected, e.g., when a user turns off the power to string 500, or the power is inadvertently interrupted, or for any other reason, power is at least temporarily discontinued to string 500, data stored in the floating body regions 24 are transferred to floating gate/ trapping layers 60 via a shadowing operation. With reference to FIGS. 25A and 25B, the shadowing operation may be performed by first applying a high positive voltage to terminal 72. After a short period of time, e.g. about 1 μs or a short period of time in the range from about 500 ns to about 10 μs, the voltage applied to terminal 72 is brought down to substantially neutral (i.e., ground), followed by application of a high positive voltage to each of terminals 70 and thus to each of control gates 66. A negative voltage is applied to terminal 76 throughout the operation, and a substantially neutral voltage is applied to terminal 74. If a memory transistor cell 50 does not have holes in the floating substrate 24 (state "0") the voltage conditions applied to that cell 50 as described will result in a potential difference between the n$^+$ junctions and the p-type floating substrate 24, sufficient to generate substrate transient hot electrons. If a cell 50 is in a state "1" (i.e., memory transistor cell 50 has holes in the floating substrate 24), a lower electric field between the n$^+$ junctions and the p-type floating substrate 24 exists, and, as a result, no transient hot electrons are generated. In the former case (state "0") the transient hot electrons that are generated are collected in the floating gate/trapping layer 60 of that cell 50 due to the electric field resulting from the high positive bias applied on the control gate 66 via terminal 70. As to cells 50 that are in state "1", transient hot electrons are not collected at the floating gates/trapping layers 60 of those cells 50. Alternatively, a high negative voltage can be applied to all terminals 70 to collect transient hot holes from floating bodies in state "1".

In one particular non-limiting embodiment, as illustrated in FIGS. 25A-25B, a voltage of about +6.0 volts is initially applied to terminal 72. After bringing the voltage applied to terminal 72 down to ground, a voltage of about +10.0 volts is applied to each terminal 70. Voltages of about 0 volts and about −10.0 volts, respectively, are applied to terminals 74 and 76 throughout the process. However, these voltage levels may vary, while maintaining the relative relationships between the charges applied, as described above. For example, voltage applied to terminal 72 may be in the range of about +3.0 volts to about +6.0 volts, prior to dropping the voltage to about 0 volts; voltage applied to terminals 70 may be in the range of about +3.0 volts to about +12.0 volts; voltage applied to terminal 74 may be in the range of about 0.0 volts to about +0.6 volts, and voltage applied to terminal 76 may be in the range of about −4.0 volts to about −12.0 volts. Further, the voltages applied to terminals 72 and 74 may be reversed, and still obtain the same result.

Figure 26:
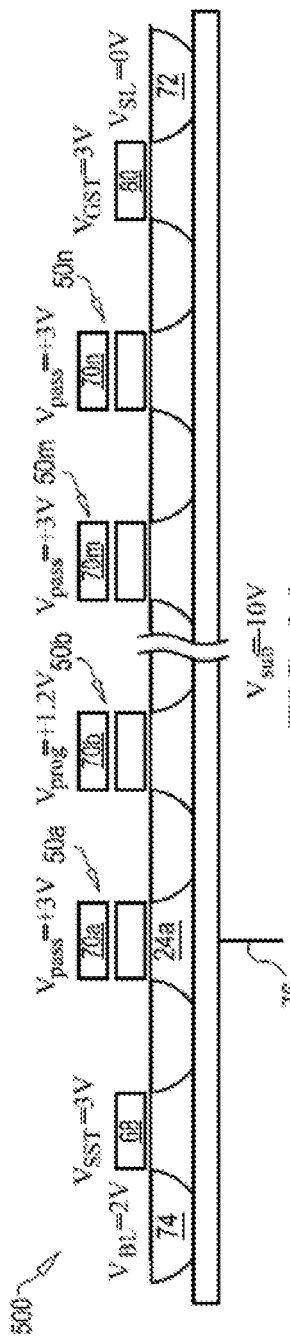
FIG. 26 illustrates a restore operation on the string of FIG. 20.

When power is restored to string 500, the states of the memory cell transistors 50 memory as stored on the floating gates/trapping layers 60 are restored into floating body regions 24. The restore operation (data restoration from non-volatile memory to volatile memory) is described with reference to FIG. 26. Prior to the restore operation/process, the floating bodies 24 are set to a neutral or negative charge, i.e., a "0" state is written to each floating body 24, via a parallel write process according to a write "0" process described above. In one embodiment, to perform the restore operation, a substantially neutral voltage is applied to terminal 72, a positive voltage is applied to terminal 74, a positive voltage that is less positive than the positive voltage applied to terminal 74 is applied to each selected terminal 70 of each selected cell 50, a positive voltage that is more positive than the positive voltage applied to terminal 74 is applied to each passing control gate via each terminal 70 of each non-selected cell 50, a positive voltage that is more positive than the positive voltage applied to terminal 74 is applied to the gate of the string selection transistor 68, a positive voltage that is more positive than the positive voltage applied to terminal 74 is applied to the gate of the ground selection transistor, and a negative voltage is applied to terminal 76. Under these conditions, if a floating gate/trapping layer 66 of a selected memory cell is not negatively charged, holes are injected from the drain side of that selected memory transistor 50 to the floating body region 24 of that cell, leaving it positively charged, i.e., state "1". Conversely, if the floating gate/trapping layer 60 of a selected cell 50 is negatively charged, no hole injection occurs into the floating substrate 24 of that cell 50 and therefore the floating substrate 24 of the cell results in state "0".

In one non-limiting exemplary embodiment of the restore process, a voltage of about 0 volts is applied to terminal 72, a voltage of about +2.0 volts is applied to terminal 74, a voltage of about +1.2 volts is applied to terminal 70 of each selected cell 50, a voltage of about +3.0 volts is applied to each terminal 70 of each non-selected cell 50, a voltage of about +3.0 volts is applied to the gate of the string selection transistor 68, a voltage of about +3.0 volts is applied to the gate of the ground selection transistor 80, and a voltage of about −10 volts is applied to terminal 76.

However, these voltage levels may vary, while maintaining the relative relationships between the charges applied, as described above. For example, voltage applied to terminal 72 may be in the range of about 0.0 volts to about +0.6 volts, voltage applied to terminal 74 may be in the range of about +1.5 volts to about +3.0 volts, voltage applied to terminal 70 of the selected control gate 66 may be in the range of about 0.0 volts to about +1.6 volts; voltage applied to the terminals 70 of the passing control gates 66 of the cells 50 not selected may be in the range of about +1.0 volts to about +5.0 volts, voltage applied to the gate of the string selection transistor 68 may be in the range of about +1.0 volts to about +5.0 volts, voltage applied to the gate of the ground selection transistor 80 may be in the range of about +1.0 volts to about +5.0 volts, and voltage applied to terminal 76 may be in the range of about −4.0 volts to about −12.0 volts. Further, the voltages applied to terminals 72 and 74 may be reversed, and still obtain the same result, even when the voltages applied to terminals 72 and 74 are not equal.

Note that this process occurs non-algorithmically in parallel (only n parallel operations are needed for an entire array of n×m cells 50, where m is a positive integer indicating the number of rows in the array), as the state of the floating gates/trapping layers 60 do not have to be read, interpreted, or otherwise measured to determine what state to restore the floating bodies 24 to. Rather, the restoration process occurs automatically, driven by electrical potential differences. Accordingly, this process is orders of magnitude faster than one that requires algorithmic intervention. Similarly, it is noted that the shadowing process also is performed as a parallel, non-algorithmic process. When multiple cells 56 are provided in a memory device, shadowing and restore operations are performed as parallel, non-algorithmic processes.

In another embodiment of string 50 can be operated to perform a volatile to non-volatile shadowing process by a hot electron injection process. To perform a shadowing process according to this embodiment, a high positive voltage is applied to terminal 72 and a substantially neutral voltage is applied to terminal 74. Alternatively, a high positive voltage can be applied to terminal 74 and a substantially neutral voltage can be applied to terminal 72. A positive voltage is applied to terminal 70 of the selected cell 50, a positive voltage that is more positive than the positive voltage applied to the terminal 70 of the selected cell is applied to each of passing control gates 66 via the terminals 70 of the non-selected cells 50, a positive voltage more positive than the positive voltage applied to terminal 74 is applied to the gate of siring selection transistor 68, a positive voltage more positive than the positive voltage applied to terminal 74 is applied to the gate of ground selection transistor 80, and a negative voltage is applied to terminal 76. A high voltage in this case is a voltage greater than or equal to about +3 volts. In one example, a voltage in the range of about +3 to about +6 volts is applied, although it is possible to apply a higher voltage. The floating gate/trapping layer 60 will have been previously initialized or reset to have a positive charge prior to the operation of the cell 50 to store data in non-volatile memory via floating body 24. When floating body 24 of a selected cell 50 has a positive charge/voltage, the NPN junction is on, as noted above, and electrons flow in the floating body 24. The application of the high voltage to terminal 72 at 16 energizes/accelerates electrons traveling through the floating body 24 to a sufficient extent that they can "jump over" the oxide barrier 62 between floating body 24 and floating gate/trapping layer 60, so that electrons enter floating gate/trapping layer 60. Accordingly, floating gate/trapping layer 60 becomes negatively charged by the shadowing process, when the volatile memory of cell 50 is in state "1" (i.e., floating both 24 is positively charged).

When volatile memory of a selected cell 50 is in state "0", i.e., floating body 24 has a negative or neutral charge/voltage, the NPN junction is off, as noted above, and electrons do not flow in the floating body 24. Accordingly, when voltages are applied to the terminals as described above, in order to perform the shadowing process, the high positive voltage applied to terminal 72 does not cause an acceleration of electrons in order to cause hot electron injection into floating gate/trapping layer 60, since the electrons are not flowing. Accordingly, floating gate/trapping layer 60 retains its positive charge at the end of the shadowing process, when the volatile memory of cell 50 is in state "0" (i.e., floating body 24 is neutral or negatively charged). Note that the charge state of the floating gate/trapping layer 60 is complementary to the charge state of the floating body 24 after completion of the shadowing process. Thus, if the floating body 24 of the memory cell 50 has a positive charge in volatile memory, the floating gate/trapping layer 60 will become negatively charged by the shadowing process, whereas if the floating body of the memory cell 50 has a negative or neutral charge in volatile memory, the floating gate/trapping layer 60 will be positively charged at the end of the shadowing operation. The charges/states of the floating gates/trapping layers 60 are determined non-algorithmically by the states of the floating bodies, and shadowing of multiple cells occurs in parallel, therefore the shadowing process is very fast.

In one particular non-limiting example of the shadowing process according to this embodiment, about +3 volts are applied to terminal 72, about 0 volts are applied to terminal 74, about +1.2 volts are applied to terminal 70 of the selected cells, about +3.0 volts are applied to terminal 70 of the unselected cells, a voltage of about +3.0 volts is applied to the gate of the string selection transistor 68, a voltage of about +3.0 volts is applied to the gate of the ground selection transistor 80, and about −10.0 volts are applied to terminal 76. However, these voltage levels may vary, while maintaining the relative relationships between the charges applied, as described above. For example, voltage applied to terminal 72 may be in the range of about +3 volts to about +6 volts, the voltage applied to terminal 74 may be in the range of about 0.0 volts to about +0.4 volts, the voltage applied to terminal 70 of the selected cells may be in the range of about 0.0 volts to about +1.6 volts; voltage applied to the terminals 70 of the passing control gates 66 of the cells 50 not selected may be in the range of about +1.0 volts to about +5.0 volts, voltage applied to the gate of the string selection transistor 68 may be in the range of about +1.0 volts to about +5.0 volts, voltage applied to the gate of the ground selection transistor 80 may be in the range of about +1.0 volts to about +5.0 volts, and voltage applied to terminal 76 may be in the range of about −4.0 volts to about −12.0 volts. To execute a complete shadowing operation of a memory device including NAND strings 500, the shadowing operations described herein with regard to NAND strings are performed "n" times.

In another embodiment to perform a restore process, terminal 72 is set to a substantially neutral voltage, a positive voltage is applied to terminal 74, a negative voltage is applied to terminal 70 of the selected cells, a positive voltage more positive than the positive voltage applied to terminal 74 is applied to terminal 70 of the unselected cells, a positive voltage more positive than the positive voltage applied to terminal 74 is applied to the gate of string selection transistor 68, a positive voltage more positive than the positive voltage applied to terminal 74 is applied to the gate of ground selection transistor 80, and a negative voltage that is more negative than the negative voltage applied to terminal 70 is applied to terminal 76. If the floating gate/trapping layer 60 of a selected cell 50 is negatively charged, this negative charge enhances the driving force for the band-to-band hot hole injection process, whereby holes are injected from the n-region 18 into floating body 24, thereby restoring the "1" state that the volatile memory cell 50 had held prior to the performance of the shadowing operation. If the floating gate/trapping layer 60 of a selected cell is not negatively charged, such as when the floating gate/trapping layer 60 is positively charged or is neutral, the hot band-to-band hole injection process will not occur, resulting in memory cell 50 having a "0" state, just as it did prior to performance of the shadowing process. Accordingly, if floating gate/trapping layer 60 has a positive charge after shadowing is performed, the volatile memory of floating body 24 will be restored to have a negative charge ("0" state), but if the floating gate/trapping layer 60 has a negative or neutral charge, the volatile memory of floating body 24 will be restored to have a positive charge ("1" state).

In one particular non-limiting example of this embodiment, about 0 volts is applied to terminal 72, about +2 volts is applied to terminal 74, about −1.2 volts is applied to terminal 70 of the selected cells, about +3.0 volts are applied to terminal 70 of the unselected cells, a voltage of about +3.0 volts is applied to the gate of the string selection transistor 68, a voltage of about +3.0 volts is applied to the gate of the ground selection transistor 80, and about −10.0 volts are applied to terminal 76. However, these voltage levels may vary, while maintaining the relative relationships between live charges applied, as described above. For example, voltage applied to terminal 72 may be in the range of about +1.5 volts to about +3.0 volts, voltage applied to terminal 74 may be in the range of about 0.0 volts to about +0.6 volts, voltage applied to terminal 70 of the selected cells may be in the range of about 0.0 volts to about −3.0 volts; voltage applied to the terminals 70 of the passing control gates 66 of the cells 50 not selected may be in the range of about +1.0 volts to about +5.0 volts, voltage applied to the gate of the string selection transistor 68 may be in the range of about +1.0 volts to about +5.0 volts, voltage applied to the gate of the ground selection transistor 80 may be in the range of about +1.0 volts to about +5.0 volts, and voltage applied to terminal 76 may be in the range of about −4.0 volts to about −12.0 volts.

Figure 27:
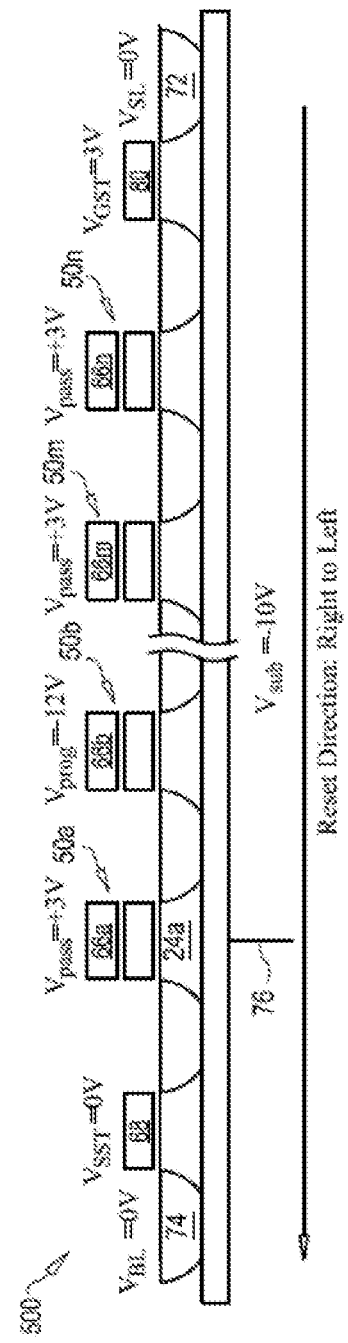
FIG. 27 illustrates a reset operation on the string of FIG. 20.

After restoring the memory cell(s) 50, the floating gates/trapping layers 60 are reset to a predetermined initial state, e.g., a positive state as illustrated in FIG. 27, so that each floating gate/trapping layer 60 has a known state prior to performing another shadowing operation. The reset process operates by the mechanism of electron tunneling from the floating gates/trapping layers 60 to the source regions 20, as illustrated in FIG. 27.

To perform a reset operation according to the embodiment of FIG. 27, a substantially neutral voltage is applied to SL terminal 72, a substantially neutral voltage is applied to BL terminal 74, a highly negative voltage is applied to the terminal 70 and thus the control gate 66 of the selected cell 50, a positive voltage is applied to each terminal 70 and passing control gate of the non-selected cells, a positive voltage is applied to the gate of the ground selection transistor, a substantially neutral voltage is applied to the gate of the string selection transistor, and a negative voltage, having a less negative voltage than the negative voltage applied to the selected cell terminal 70, is applied to terminal 76. Under these conditions, electrons will tunnel from the selected floating gates/trapping layers 60 of the selected cells 50 to the n⁺ source junction region of each selected cell 50. As a result, the floating gates/trapping layers 60 will be left in a positively charged state. The reset operation is performed in the direction of the common source (from memory cell transistor 58*n*) to the bit line (to memory cell transistor 58*a*), i.e. in the direction of the arrow shown in FIG. 27. To execute a complete reset operation of a memory device including NAND strings 500, the reset operations described herein with regard to NAND strings are performed "n" times.

Alternatively, if hot holes are collected during the shadowing operation, that a high positive voltage (e.g., about +18 volts, or in the range of about +12 volts to about +20 volts) is applied to the terminals 70 of the selected cells to reset the floating gates/trapping layers 60 of the selected cells to the initial state. Under this condition, electron will tunnel into the selected floating gates/trapping layers 60 from the respective n⁺ junction regions, resulting in the floating gates/trapping layers 60 becoming negatively charged.

In one particular non-limiting embodiment, as illustrated in FIG. 27, about 0 volts is applied to terminal 72, about 0 volts is applied to terminal 74, about −12.0 volts is applied to each terminal 70 of a selected cell 50, about +3V is applied to each terminal 70 (and passing control gate 66) of a non-selected cell 50, about +3 volts is applied to the gate of the ground selection transistor 80, about 0 volts is applied to the gate of the string selection transistor, and about −10.0 volts is applied to terminal 76.

However, these voltage levels may vary, while maintaining the relative relationships between the charges applied, as described above. For example, voltage applied to terminal 72 may be in the range of about 0.0 volts to about +3.0 volts, voltage applied to terminal 74 may be in the range of about 0.0 volts to about +3.0 volts, voltage applied to terminal 70 of the selected control gate 66 may be in the range of about −12.0 volts to about −20.0 volts; voltage applied to the terminals 70 of the passing control gates 66 of the cells 50 not selected may be in the range of about +1.0 volts to about +5.0 volts, voltage applied to the gate of the string selection transistor 68 may be in the range of about +1.0 volts to about +5.0 volts, voltage applied to the gate of the ground selection transistor 80 may be in the range of about +1.0 volts to about +5.0 volts, and voltage applied to terminal 76 may be in the range of about −4.0 volts to about −12.0 volts.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

That which is claimed is:

1. A semiconductor memory device comprising a string of memory
   cells connected in series, each said memory cell having:
   a floating body region configured to be charged to a level of charge indicative of a state of said memory cell to store data as volatile memory indicative of said state of said memory cell;
   a first region in electrical contact with said floating body region;
   a second region in electrical contact with said floating body region and spaced apart from said first region;
   a floating gate or trapping layer positioned between said first and second regions and configured to receive transfer of said data stored as volatile memory and store said data as non-volatile memory indicative of said state of the memory cell; and
   a control gate positioned above said floating gate or trapping layer;
   wherein said level of charge stored in said floating body region determines a level of charge stored in said floating gate or trapping layer upon interruption of power to said semiconductor memory device; and
   wherein said transfer of data to said floating gate or trapping layer occurs to at least two of said memory cells.

2. The semiconductor memory device of claim 1, wherein said
   floating body region has a first conductivity type selected from a p-type conductivity type and
   an n-type conductivity type;
   said first region has a second conductivity type selected from said p-type and n-type conductivity types, said second conductivity type being different from said first conductivity type; and
   said second region has said second conductivity type.

3. The semiconductor memory device of claim 1, wherein said transfer of data to said floating gate or trapping layer occurs in a non-algorithmic manner.

4. The semiconductor memory device of claim 1, wherein said transfer of data to said floating gate or trapping layer occurs upon interruption of power to said semiconductor memory device.

5. The semiconductor memory device of claim 4, wherein when power is restored to the device, data transfer from the floating gate or trapping layer to the floating body occurs in a non-algorithmic manner, and the device functions as volatile memory.

6. A semiconductor memory device comprising a string of memory
   cells connected in series, each said memory cell having:

a floating body region configured to be charged to a level of charge indicative of a state of said memory cell to store data as volatile memory indicative of said state of said memory cell;

a first region in electrical contact with said floating body region;

a second region in electrical contact with said floating body region and spaced apart from said first region;

a floating gate or trapping layer positioned between said first and second regions and configured to receive transfer of said data stored as volatile memory and store said data as nonvolatile memory indicative of said state of the memory cell; and a control gate positioned above said floating gate or trapping layer, wherein said level of charge indicative of said state of said memory cell stored in said floating body region determines a current flowing through said semiconductor memory cell, and wherein said transfer of data to said floating gate or trapping layer occurs to at least two of said memory cells.

7. The semiconductor memory device of claim 6, wherein said floating body region has a first conductivity type selected from a p-type conductivity type and an n-type conductivity type;

said first region has a second conductivity type selected from said p-type and n-type conductivity types, said second conductivity type being different from said first conductivity type; and said second region has said second conductivity type.

8. The semiconductor memory device of claim 6, wherein said floating gate or trapping layer receives transfer of said data upon interruption of power to said semiconductor memory device.

9. The semiconductor memory device of claim 6, wherein said current flowing through said semiconductor memory cell determines the charge stored in said floating gate or trapping layer upon interruption of power to said semiconductor memory device.

10. The semiconductor memory device of claim 6, wherein said transfer of data to said floating gate or trapping layer occurs in a non-algorithmic manner.

11. The semiconductor memory device of claim 8, wherein when power is restored to said semiconductor memory device, data transfer from said floating gate or trapping layer to said floating body occurs in a non-algorithmic manner, and said semiconductor memory device functions as volatile memory.

12. A semiconductor memory device comprising a string of memory cells connected in series, each said memory cell having:

a floating body region; and a floating gate or trapping layer positioned above and insulated from said floating body region;

wherein said floating body region is configured to be charged to a level indicative of a state of said memory cell based on a charge stored in said floating gate or trapping layer, upon restoration of power to said semiconductor memory device, and wherein said transfer of data to said floating body region upon said restoration of power occurs to at least two of said memory cells.

13. The semiconductor memory device of claim 12, wherein said memory device functions as volatile memory upon said restoration of power to said memory device.

14. The semiconductor memory device of claim 12, wherein said floating body region is configured to a predetermined state prior to being charged based on charge stored in said floating body or trapping layer.

15. The semiconductor memory device of claim 12, wherein said floating gate or trapping layer is configured to a predetermined state after said floating body region is charged to a level based on charge stored in said floating gate or trapping layer.

16. The semiconductor memory device of claim 12, further comprising a control gate positioned above said floating gate or trapping layer.

17. The semiconductor memory device of claim 12, further comprising a first region in electrical contact with said floating body region and a second region spaced apart from said first region and in electrical contact with said floating body region.

* * * * *